US011955921B2

(12) United States Patent
Liu et al.

(10) Patent No.: US 11,955,921 B2
(45) Date of Patent: Apr. 9, 2024

(54) SYSTEM AND METHOD FOR IMPROVING COLOR APPEARANCE OF SOLAR ROOFS

(71) Applicant: Tesla, Inc., Austin, TX (US)

(72) Inventors: John Liu, Fremont, CA (US); Yangsen Kang, Santa Clara, CA (US); Anh N. Duong, Fremont, CA (US); Yongkee Chae, San Ramon, CA (US); Milan Padilla, Mountain View, CA (US); Chen Wang, Fremont, CA (US); Remy D. Labesque, Manhattan Beach, CA (US)

(73) Assignee: Tesla, Inc., Austin, TX (US)

(*) Notice: Subject to any disclaimer, the term of this patent is extended or adjusted under 35 U.S.C. 154(b) by 115 days.

(21) Appl. No.: 17/841,034

(22) Filed: Jun. 15, 2022

(65) Prior Publication Data
US 2022/0311374 A1 Sep. 29, 2022

Related U.S. Application Data

(63) Continuation of application No. 16/533,524, filed on Aug. 6, 2019, now Pat. No. 11,431,280.

(51) Int. Cl.
H02S 20/25 (2014.01)
H01L 31/0216 (2014.01)
(Continued)

(52) U.S. Cl.
CPC ........ *H02S 20/25* (2014.12); *H01L 31/02167* (2013.01); *H01L 31/02366* (2013.01);
(Continued)

(58) Field of Classification Search
CPC ............... H02S 20/25; H01L 31/02167; H01L 31/02366; H01L 31/03682; H01L 31/0488;
(Continued)

(56) References Cited

U.S. PATENT DOCUMENTS 3,076,861 A 2/1963 Samulon et al.
3,369,939 A 2/1968 Myer
(Continued)

FOREIGN PATENT DOCUMENTS

CN 102544380 B 8/2015
CN 103426957 B 3/2016
(Continued)

OTHER PUBLICATIONS

Final Office Action received for U.S. Appl. No. 17/199,303, dated Apr. 28, 2022, 25 pages.
(Continued)

*Primary Examiner* — Michael Y Sun
(74) *Attorney, Agent, or Firm* — DLA Piper LLP (US)

(57) ABSTRACT

One embodiment can provide a photovoltaic roof tile. The photovoltaic roof tile can include a transparent front cover, a transparent back cover, and a plurality of polycrystalline-Si-based photovoltaic structures positioned between the front cover and the back cover. A respective polycrystalline-Si-based photovoltaic structure has a front surface facing the front cover and a back surface facing the back cover. The photovoltaic roof tile can further include a paint layer positioned on a back surface of the back cover facing away from the front cover. A color of the paint layer substantially matches a color of the front surface of the respective polycrystalline-Si-based photovoltaic structure.

12 Claims, 24 Drawing Sheets
(18 of 24 Drawing Sheet(s) Filed in Color)

TEXTURE 1

TEXTURE 2

TEXTURE 3

TEXTURE 4

(51) Int. Cl.
  *H01L 31/0236* (2006.01)
  *H01L 31/0368* (2006.01)
  *H01L 31/048* (2014.01)
  *H01L 31/049* (2014.01)
  *H01L 31/18* (2006.01)

(52) U.S. Cl.
  CPC .... *H01L 31/03682* (2013.01); *H01L 31/0488* (2013.01); *H01L 31/049* (2014.12); *H01L 31/1804* (2013.01)

(58) Field of Classification Search
  CPC ... H01L 31/049; H01L 31/1804; H01L 31/02; Y02B 10/10; Y02E 10/50; Y02E 10/546; Y02E 10/547
  See application file for complete search history.

(56) References Cited

U.S. PATENT DOCUMENTS

| | | |
|---|---|---|
| 3,461,602 A | 8/1969 | Hasel et al. |
| 4,239,810 A | 12/1980 | Alameddine et al. |
| 4,461,922 A | 7/1984 | Gay et al. |
| 4,713,493 A | 12/1987 | Ovshinsky |
| 4,724,011 A | 2/1988 | Turner et al. |
| 5,118,540 A | 6/1992 | Hutchison |
| 5,149,351 A | 9/1992 | Yaba et al. |
| 5,338,369 A | 8/1994 | Rawlings |
| 5,427,961 A | 6/1995 | Takenouchi et al. |
| 5,590,495 A | 1/1997 | Bressler et al. |
| 5,667,596 A | 9/1997 | Tsuzuki et al. |
| 5,942,048 A | 8/1999 | Fujisaki et al. |
| 6,133,522 A | 10/2000 | Kataoka et al. |
| 6,307,144 B1 | 10/2001 | Mimura et al. |
| 6,311,436 B1 | 11/2001 | Mimura et al. |
| 6,365,824 B1 | 4/2002 | Nakazima et al. |
| 6,472,594 B1 | 10/2002 | Ichinose et al. |
| 6,515,216 B2 | 2/2003 | Zenko et al. |
| 6,586,271 B2 | 7/2003 | Hanoka |
| 6,620,645 B2 | 9/2003 | Chandra et al. |
| 6,960,716 B2 | 11/2005 | Matsumi et al. |
| 7,259,321 B2 | 8/2007 | Oswald et al. |
| 7,276,724 B2 | 10/2007 | Sheats et al. |
| 7,506,477 B2 | 3/2009 | Flaherty et al. |
| 7,534,956 B2 | 5/2009 | Kataoka et al. |
| 7,772,484 B2 | 8/2010 | Li et al. |
| 7,833,808 B2 | 11/2010 | Xu et al. |
| 7,851,700 B2 | 12/2010 | Luch |
| 7,858,874 B2 | 12/2010 | Ruskin et al. |
| 7,902,451 B2 | 3/2011 | Shimizu |
| 7,964,440 B2 | 6/2011 | Salleo et al. |
| 8,205,400 B2 | 6/2012 | Allen |
| 8,206,664 B2 | 6/2012 | Lin |
| 8,276,329 B2 | 10/2012 | Lenox |
| 8,471,141 B2 | 6/2013 | Stancel et al. |
| 8,664,030 B2 | 3/2014 | Luch |
| 8,674,377 B2 | 3/2014 | Farquhar |
| 8,701,360 B2 | 4/2014 | Ressler |
| 8,713,861 B2 | 5/2014 | Desloover |
| 8,822,810 B2 | 9/2014 | Luch |
| 9,038,330 B2 | 5/2015 | Bellavia |
| 9,150,966 B2 | 10/2015 | Xu et al. |
| 9,206,520 B2 | 12/2015 | Barr et al. |
| 9,343,592 B2 | 5/2016 | Hunt |
| 9,362,527 B2 | 6/2016 | Takemura |
| 9,412,884 B2 | 8/2016 | Heng et al. |
| 9,525,092 B2 | 12/2016 | Mayer et al. |
| 9,825,582 B2 | 11/2017 | Fernandes et al. |
| 9,882,077 B2 | 1/2018 | Morad et al. |
| 9,899,554 B2 | 2/2018 | Yang et al. |
| 9,966,487 B2 | 5/2018 | Magnusdottir et al. |
| 10,056,522 B2 | 8/2018 | Gonzalez |
| 10,145,116 B2 | 12/2018 | Holt et al. |
| 10,381,973 B2 | 8/2019 | Liu et al. |
| 2001/0054435 A1 | 12/2001 | Nagao et al. |
| 2002/0015782 A1 | 2/2002 | Abys et al. |
| 2002/0182769 A1 | 12/2002 | Campbell |
| 2002/0185171 A1 | 12/2002 | Huang et al. |
| 2003/0180983 A1 | 9/2003 | Oswald et al. |
| 2004/0261840 A1 | 12/2004 | Schmit et al. |
| 2005/0039788 A1 | 2/2005 | Blieske et al. |
| 2005/0268963 A1 | 12/2005 | Jordan et al. |
| 2006/0048798 A1 | 3/2006 | Mccoy et al. |
| 2006/0086620 A1 | 4/2006 | Chase et al. |
| 2006/0204730 A1 | 9/2006 | Nakamura et al. |
| 2007/0289623 A1 | 12/2007 | Atwater |
| 2008/0135085 A1 | 6/2008 | Corrales et al. |
| 2008/0156372 A1 | 7/2008 | Wu |
| 2008/0178932 A1 | 7/2008 | Den et al. |
| 2009/0101192 A1 | 4/2009 | Kothari et al. |
| 2009/0120497 A1 | 5/2009 | Schetty, Iii |
| 2009/0133738 A1 | 5/2009 | Shiao et al. |
| 2009/0133739 A1 | 5/2009 | Shiao et al. |
| 2009/0133740 A1 | 5/2009 | Shiao et al. |
| 2009/0165849 A1 | 7/2009 | Chan et al. |
| 2009/0233083 A1 | 9/2009 | Inoue et al. |
| 2009/0242021 A1 | 10/2009 | Petkie et al. |
| 2009/0255568 A1 | 10/2009 | Morgan |
| 2009/0287446 A1 | 11/2009 | Wang et al. |
| 2009/0308435 A1 | 12/2009 | Caiger |
| 2010/0000603 A1 | 1/2010 | Tsuzuki |
| 2010/0006147 A1 | 1/2010 | Nakashima et al. |
| 2010/0018568 A1 | 1/2010 | Nakata |
| 2010/0065116 A1 | 3/2010 | Stancel et al. |
| 2010/0132762 A1 | 6/2010 | Graham et al. |
| 2010/0147363 A1 | 6/2010 | Huang |
| 2010/0147364 A1 | 6/2010 | Gonzalez et al. |
| 2010/0180929 A1 | 7/2010 | Raymond et al. |
| 2010/0282318 A1 | 11/2010 | Kalkanoglu et al. |
| 2011/0023937 A1 | 2/2011 | Daniel et al. |
| 2011/0023942 A1 | 2/2011 | Soegding et al. |
| 2011/0030761 A1 | 2/2011 | Kalkanoglu et al. |
| 2011/0277825 A1 | 11/2011 | Fu et al. |
| 2012/0000502 A1 | 1/2012 | Wiedeman et al. |
| 2012/0012162 A1 | 1/2012 | Kobayashi |
| 2012/0031470 A1 | 2/2012 | Dimov et al. |
| 2012/0048349 A1 | 3/2012 | Metin et al. |
| 2012/0060911 A1 | 3/2012 | Fu et al. |
| 2012/0125391 A1 | 5/2012 | Pinarbasi et al. |
| 2012/0199184 A1 | 8/2012 | Nie et al. |
| 2012/0204939 A1 | 8/2012 | Lee et al. |
| 2012/0237670 A1 | 9/2012 | Lim et al. |
| 2012/0285508 A1 | 11/2012 | Lee |
| 2013/0048062 A1 | 2/2013 | Min et al. |
| 2013/0061913 A1 | 3/2013 | Willham et al. |
| 2013/0160823 A1 | 6/2013 | Khouri et al. |
| 2013/0206213 A1 | 8/2013 | He et al. |
| 2013/0209776 A1 | 8/2013 | Kim |
| 2013/0233378 A1 | 9/2013 | Moslehi et al. |
| 2013/0247959 A1 | 9/2013 | Kwon et al. |
| 2013/0255755 A1 | 10/2013 | Chich |
| 2013/0280521 A1 | 10/2013 | Mori |
| 2014/0120699 A1 | 5/2014 | Hua et al. |
| 2014/0124014 A1 | 5/2014 | Morad et al. |
| 2014/0196768 A1 | 7/2014 | Heng et al. |
| 2014/0313574 A1 | 10/2014 | Bills et al. |
| 2014/0342492 A1 | 11/2014 | Choi et al. |
| 2014/0360582 A1 | 12/2014 | Cui et al. |
| 2015/0022876 A1 | 1/2015 | Ma et al. |
| 2015/0090314 A1 | 4/2015 | Yang et al. |
| 2015/0155824 A1 | 6/2015 | Chien |
| 2015/0194552 A1 | 7/2015 | Ogasahara et al. |
| 2015/0243931 A1 | 8/2015 | Fukuura |
| 2015/0270410 A1 | 9/2015 | Heng et al. |
| 2015/0349145 A1 | 12/2015 | Morad et al. |
| 2015/0349152 A1 | 12/2015 | Voss et al. |
| 2015/0349703 A1 | 12/2015 | Morad et al. |
| 2016/0013329 A1 | 1/2016 | Brophy et al. |
| 2016/0020338 A1 | 1/2016 | Beck et al. |
| 2016/0105144 A1 | 4/2016 | Haynes et al. |
| 2016/0163902 A1 | 6/2016 | Podlowski |
| 2016/0181446 A1 | 6/2016 | Kalkanoglu et al. |
| 2016/0225931 A1 | 8/2016 | Heng et al. |
| 2017/0033250 A1 | 2/2017 | Ballif et al. |

(56) References Cited

U.S. PATENT DOCUMENTS

| | | |
|---|---|---|
| 2017/0077343 A1 | 3/2017 | Morad et al. |
| 2017/0141244 A1 | 5/2017 | Khaled |
| 2017/0194516 A1 | 7/2017 | Reddy et al. |
| 2017/0222082 A1 | 8/2017 | Lin et al. |
| 2018/0115275 A1 | 4/2018 | Flanigan et al. |
| 2018/0123504 A1 | 5/2018 | Almy et al. |
| 2018/0158974 A1 | 6/2018 | Hiraki et al. |
| 2018/0166601 A1 | 6/2018 | Inaba |
| 2018/0337629 A1 | 11/2018 | Liu et al. |
| 2019/0097571 A1 | 3/2019 | Lefevre et al. |
| 2020/0007074 A1 | 1/2020 | Peterson et al. |
| 2021/0044250 A1 | 2/2021 | Liu et al. |
| 2021/0203272 A1 | 7/2021 | Lefevre et al. |

FOREIGN PATENT DOCUMENTS

| | | | |
|---|---|---|---|
| CN | 102956730 B | 6/2016 | |
| DE | 102007054124 A1 | 5/2009 | |
| EP | 1058320 A2 | 12/2000 | |
| EP | 2051124 A2 | 4/2009 | |
| EP | 2709160 A1 | 3/2014 | |
| GB | 2278618 A | 12/1994 | |
| GB | 2431773 A | 5/2007 | |
| JP | 57-141979 A | 9/1982 | |
| JP | 6020586 A | 2/1985 | |
| JP | 6-140657 A | 5/1994 | |
| JP | 6-264571 A | 9/1994 | |
| JP | 2000-091610 A | 3/2000 | |
| JP | 2000-216415 A | 8/2000 | |
| JP | 2013-211385 A | 10/2013 | |
| TW | 201039452 A | 11/2010 | |
| WO | 2008/136872 A2 | 11/2008 | |
| WO | WO-2008137966 A2 * | 11/2008 | ....... H01L 31/02008 |
| WO | 2009/062106 A1 | 5/2009 | |
| WO | 2009/099418 A2 | 8/2009 | |
| WO | 2010/128375 A2 | 11/2010 | |
| WO | 2011/128757 A1 | 10/2011 | |
| WO | 2013/059441 A1 | 4/2013 | |
| WO | 2013/067541 A1 | 5/2013 | |
| WO | 2013/102181 A1 | 7/2013 | |
| WO | 2014/178180 A1 | 11/2014 | |
| WO | 2015/155356 A1 | 10/2015 | |
| WO | 2016/090341 A1 | 6/2016 | |
| WO | 2018/158470 A2 | 9/2018 | |

OTHER PUBLICATIONS

Notice of Allowance received for U.S. Appl. No. 16/025,834, dated May 12, 2022, 11 pages.
Notice of Allowance received for U.S. Appl. No. 17/199,303, dated Jun. 14, 2022, 8 pages.
Advisory Action received for U.S. Appl. No. 15/719,244, dated Aug. 12, 2020, 6 pages.
Final Office Action received for U.S. Appl. No. 15/598,194, dated Jun. 22, 2018, 17 pages.
Final Office Action received for U.S. Appl. No. 15/719,244, dated Feb. 19, 2020, 22 pages.
Final Office Action received for U.S. Appl. No. 16/025,834, dated Apr. 10, 2020, 11 pages.
Final Office Action received for U.S. Appl. No. 16/025,834, dated May 7, 2021, 18 pages.
Final Office Action received for U.S. Appl. No. 16/533,524, dated Apr. 15, 2021, 14 pages.
First Action Interview - Office Action received for U.S. Appl. No. 15/719,244, dated Aug. 20, 2019, 6 pages.
First Action Interview Office Action received for U.S. Appl. No. 15/598,194, dated Feb. 12, 2018, 7 pages.
International Preliminary Report on Patentability received for PCT Patent Application No. PCT/US2018/030492, dated Nov. 28, 2019, 9 pages.
International Preliminary Report on Patentability received for PCT Patent Application No. PCT/US2020/044790, dated Feb. 17, 2022, 13 pages.
International Search Report and Written Opinion received for PCT Patent Application No. PCT/US2018/030492, dated Jul. 20, 2018, 12 pages.
International Search Report and Written Opinion received for PCT Patent Application No. PCT/US2020/044790, dated Feb. 3, 2021, 19 pages.
Invitation to Pay Additional Fees received for PCT Patent Application No. PCT/US2020/044790, dated Nov. 5, 2020, 9 pages.
Non-Final Office Action received for U.S. Appl. No. 16/025,834, dated Dec. 24, 2020, 14 pages.
Non-Final Office Action received for U.S. Appl. No. 16/025,834, dated Sep. 6, 2019, 10 pages.
Non-Final Office Action received for U.S. Appl. No. 16/533,524, dated Nov. 5, 2021, 10 pages.
Non-Final Office Action received for U.S. Appl. No. 16/533,524, dated Sep. 3, 2020, 16 pages.
Non-Final Office Action received for U.S. Appl. No. 17/199,303, dated Nov. 10, 2021, 32 pages.
Notice of Allowance received for U.S. Appl. No. 15/598,194, dated Apr. 3, 2019, 11 pages.
Notice of Allowance received for U.S. Appl. No. 15/719,244, dated Dec. 11, 2020, 11 pages.
Notice of Allowance received for U.S. Appl. No. 16/533,524, dated May 9, 2022, 7 pages.
Office Action received for European Patent Application No. 18730466.2, dated Mar. 2, 2022, 6 pages.
Office Action received for Indian Patent Application No. 201947046252, dated Oct. 7, 2021, 8 pages.
Pre-Interview First Office Action received for U.S. Appl. No. 15/598,194, dated Dec. 21, 2017, 5 pages.
Pre-Interview First Office Action received for U.S. Appl. No. 15/719,244, dated Jun. 13, 2019, 5 pages.
Balucani et al., "A new approach: low cost masking material and efficient copper metallization for higher efficiency silicon solar cells", IEEE, 2015, 6 pages.
Fan et al., "Laser micromachined wax-covered plastic paper as both sputter deposition shadow masks and deep-ultraviolet patterning masks for polymethylmacrylate-based microfluidic systems", vol. 12, No. 4, Journal of Micro/ Nanolithography, MEMS, and MOEMS,http://nanolithography.spiedigitallibrary.org/ on Mar. 17, 2016 Terms of Use: http://spiedigitallibrary.org/ss/TermsOfUse.aspx, Dec. 16, 2013, pp. 1-6.
Lin et al., "Fabrication of Antireflective Nanostructures for Crystalline Silicon Solar Cells by Reactive Ion Etching", Thin Solid Films 529, 2013, pp. 138-142.
Pelisset et al., "Efficiency of Silicon Thin-Film photovoltaic Modules with a Front Coloured Glass", Proceeding of the CISBAT International Conference, 2011, 6 pages.
Poole et al., "Recovery Act: Organic Coatings as Encapsulants for Low Cost, High Performance PV Modules", Final Technical Report, PPG Industries Inc., Nov. 16, 2011, 35 pages.
Vyas et al., "An inorganic/organic hybrid coating for Low Cost metal mounted dye-sensitized solar cells", 223rd ECS Meeting, The Electrochemical Society, 2013, 1 page.
Office Action received for Australian Patent Application No. 2020326625, dated Nov. 30, 2022, 4 pages.

* cited by examiner

TEXTURE 1
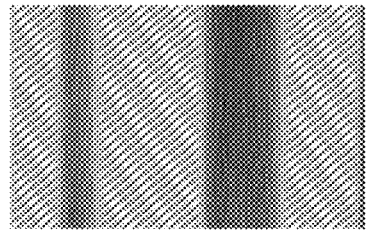
TEXTURE 2
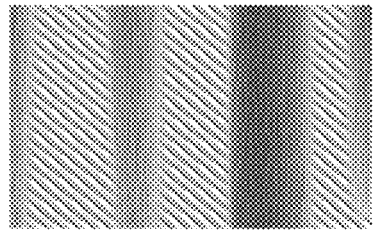
TEXTURE 3
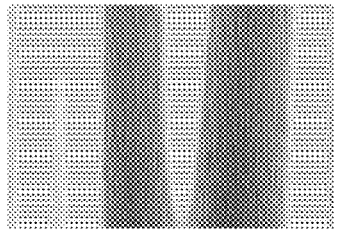
TEXTURE 4
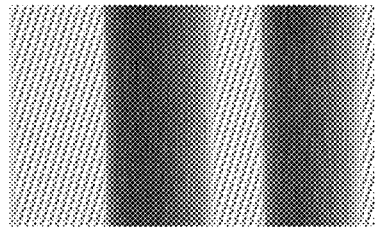
FIG. 16A
FIG. 16B

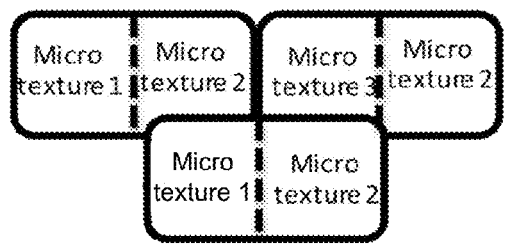 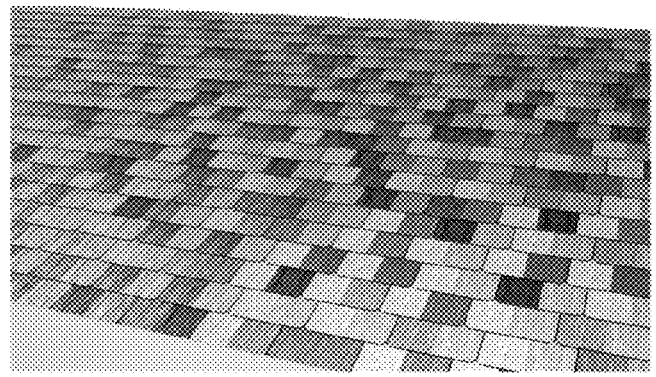
FIG. 17A
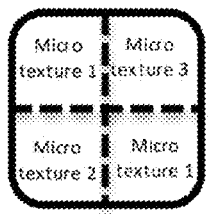 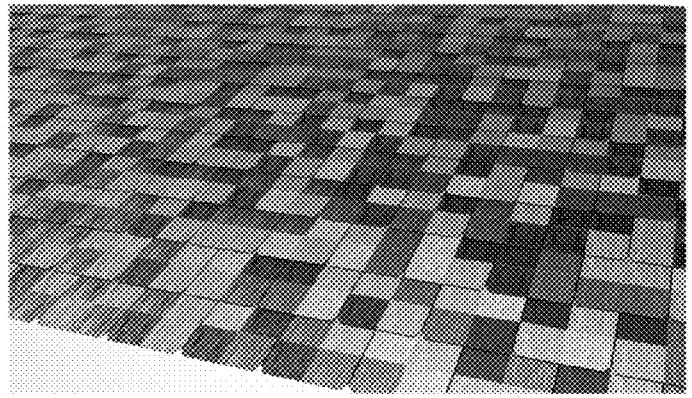
FIG. 17B

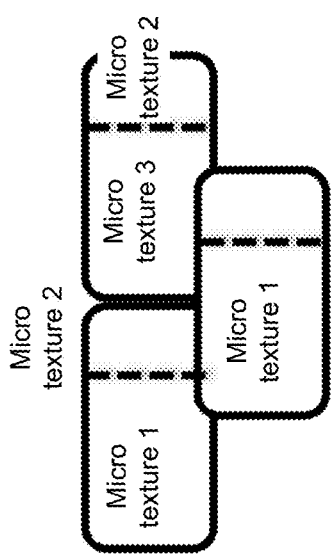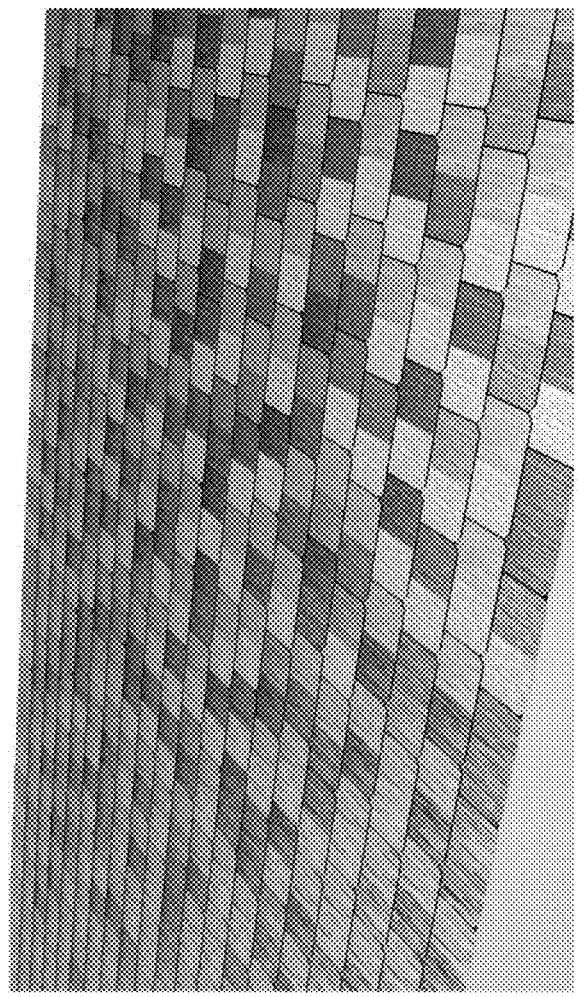
FIG. 18

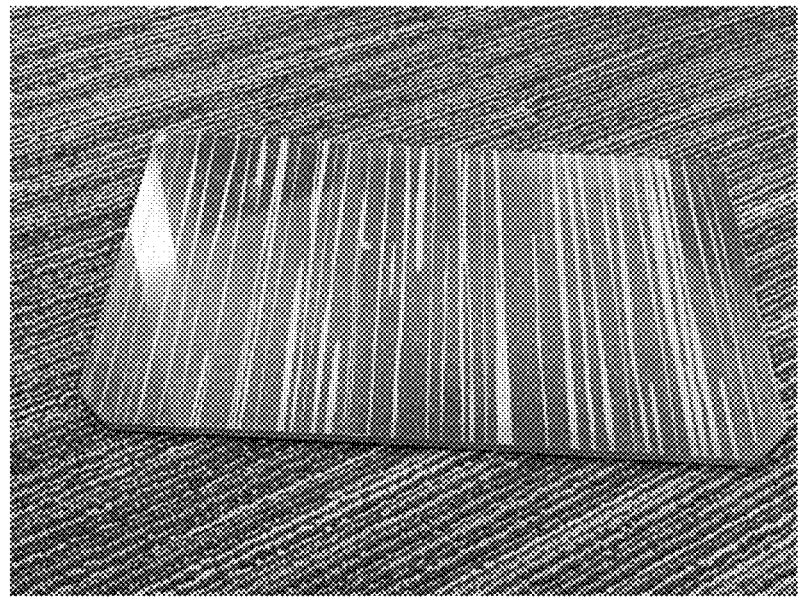
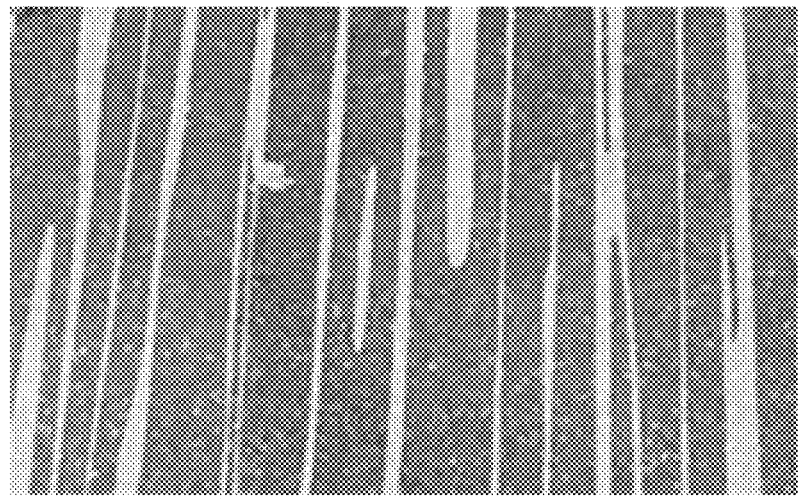
FIG. 20

SYSTEM AND METHOD FOR IMPROVING COLOR APPEARANCE OF SOLAR ROOFS

CROSS-REFERENCE TO RELATED APPLICATIONS

This application is a continuation of U.S. application Ser. No. 16/533,524, entitled "SYSTEM AND METHOD FOR IMPROVING COLOR APPEARANCE OF SOLAR ROOFS," filed on Aug. 6, 2019, the content of which is hereby incorporated by reference in its entirety for all purposes.

BACKGROUND

Field

This disclosure is generally related to photovoltaic (or "PV") roof tiles. More specifically, this disclosure is related to photovoltaic roof tiles that have consistent and isotropic color appearance.

Related Art

In residential and commercial solar energy installations, a building's roof typically is installed with photovoltaic (PV) modules, also called PV or solar panels, that can include a two-dimensional array (e.g., 6×12) of solar cells. A PV roof tile (or solar roof tile) can be a particular type of PV module offering weather protection for the home and a pleasing aesthetic appearance, while also functioning as a PV module to convert solar energy to electricity. The PV roof tile can be shaped like a conventional roof tile and can include one or more solar cells encapsulated between a front cover and a back cover, but typically enclose fewer solar cells than a conventional solar panel.

The front and back covers can be fortified glass or other material that can protect the solar cells from weather elements. To ensure sufficient transmission of sunlight, the front cover needs to be transparent, whereas the encapsulated photovoltaic structures are often dark colored. When viewed from a shallow angle (e.g., when the roof is viewed from the street), the dark-colored photovoltaic structures can become visible. The color contrast between the photovoltaic structures and the glass cover can create a scene that is not aesthetically pleasing. Moreover, a solar roof typically includes a mixture of PV roof tiles as well as non-PV roof tiles, with the non-PV roof tiles installed at locations that are less likely to receive sufficient sunlight. Although the non-PV roof tiles can include similar glass covers as those of the PV roof tiles, the absence of embedded photovoltaic structures can result in the non-PV roof tiles having a different color appearance than that of the PV roof tiles.

SUMMARY

One embodiment can provide a photovoltaic roof tile. The photovoltaic roof tile can include a transparent front cover, a transparent back cover, and a plurality of polycrystalline-Si-based photovoltaic structures positioned between the front cover and the back cover. A respective polycrystalline-Si-based photovoltaic structure has a front surface facing the front cover and a back surface facing the back cover. The photovoltaic roof tile can further include a paint layer positioned on a back surface of the back cover facing away from the front cover. A color of the paint layer can substantially match a color of the front surface of the respective polycrystalline-Si-based photovoltaic structure.

In a variation on this embodiment, the front surface of the respective polycrystalline-Si-based photovoltaic structure is textured using a reactive ion etching (RIE) technique.

In a further variation, features of the textured front surface of the respective polycrystalline-Si-based photovoltaic structure have a dimension less than one micron.

In a variation on this embodiment, a front surface of the transparent front cover is textured.

In a further variation, the textured front surface of the transparent front cover can include a first texture pattern superimposed on a second texture pattern, and a feature size of the first texture pattern is smaller than a feature size of the second texture pattern.

In a variation on this embodiment, the paint layer can include a polymer-based paint.

One embodiment provides a system and method for fabricating a plurality of photovoltaic roof tiles. During operation, the system obtains a plurality of photovoltaic structures, with a respective photovoltaic structure comprising a front surface and a back surface. The system measures a color of the front surface of each photovoltaic structure, groups the photovoltaic structures into at least two groups based on the measured color of the front surface of each photovoltaic structure, and forms the plurality of photovoltaic roof tiles by sequentially selecting photovoltaic structures from the at least two groups based on a predetermined pattern. A respective photovoltaic roof tile can include at least two photovoltaic structures encapsulated between a front transparent cover and a back transparent cover.

One embodiment provides a system and method for forming a photovoltaic roof comprising a plurality of photovoltaic roof tiles and a plurality of non-photovoltaic roof tiles. During operation, the system fabricates the plurality of photovoltaic roof tiles and the plurality of non-photovoltaic roof tiles. A respective photovoltaic roof tile can include a transparent front cover, a transparent back cover, and a plurality of photovoltaic structures encapsulated between the front and back covers. Fabricating the plurality of photovoltaic roof tiles can include measuring a color of a front surface of each photovoltaic structure and applying a paint layer on a back surface of the back cover, and a color of the paint layer can substantially match the measured color. A respective non-photovoltaic roof tile can include a glass substrate and a second paint layer positioned on a back surface of the glass substrate. The system then installs the photovoltaic roof tiles and the non-photovoltaic roof tiles at predetermined locations on a roof.

BRIEF DESCRIPTION OF THE FIGURES

The patent or application file contains at least one drawing executed in color. Copies of this patent or patent application publication with color drawing(s) will be provided by the Office upon request and payment of the necessary fee.

FIG. 16A shows various exemplary microtexture patterns on a glass surface, according to one embodiment.

FIG. 16B shows a partial view of a roof having tiles with different texture patterns, according to one embodiment.

FIGS. 17A-17B show exemplary scenarios of in-tile color contrast, according to one embodiment.

FIG. 18 shows a different scenario of in-tile color contrast, according to one embodiment.

FIG. 20 shows an exemplary roof tile cover having a tree bark surface texture, according to one embodiment.

In the figures, like reference numerals refer to the same figure elements.

DETAILED DESCRIPTION

Figure 1:
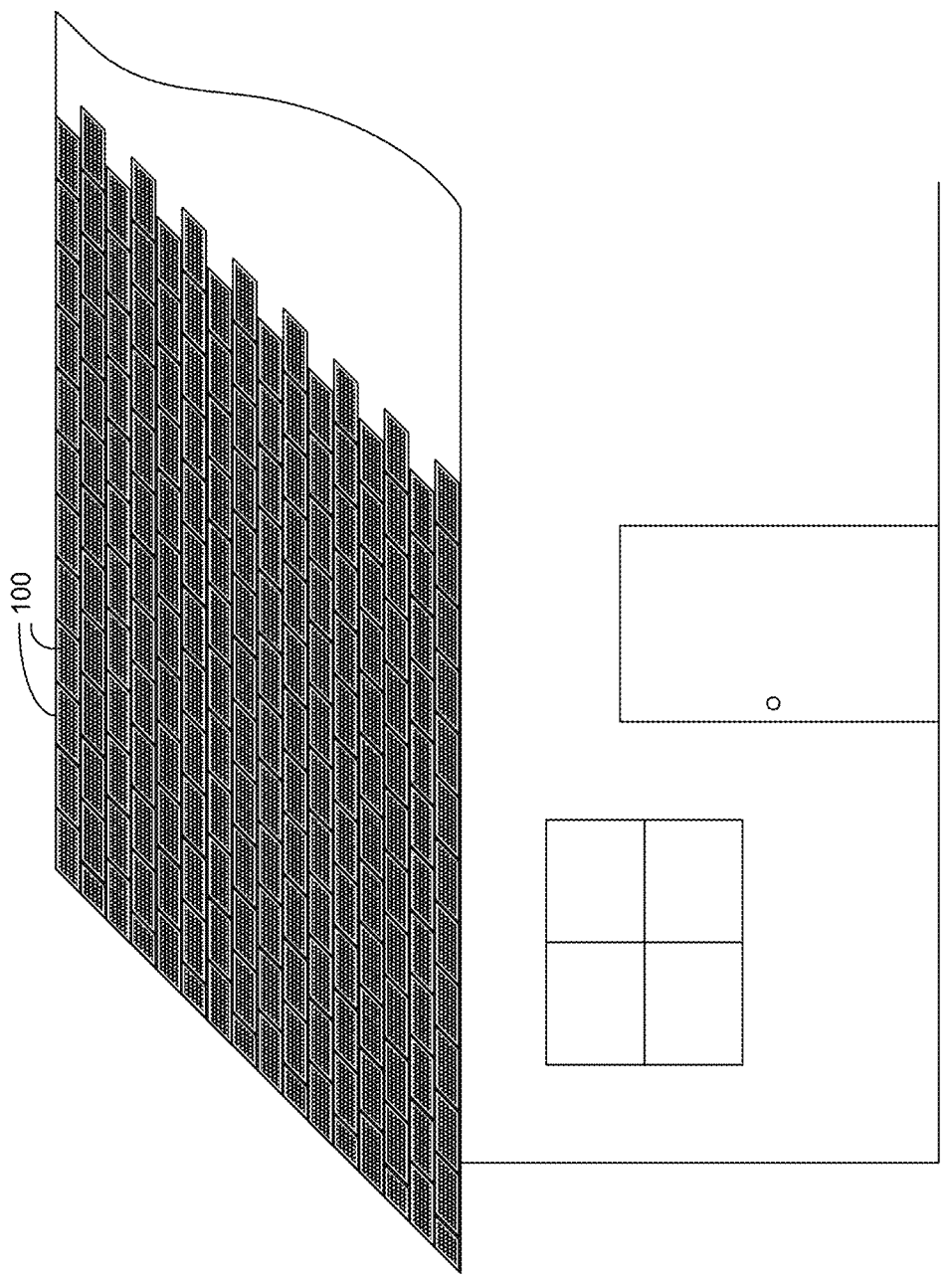
FIG. 1 shows an exemplary configuration of photovoltaic (PV) roof tiles on a house.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the disclosed system is not limited to the embodiments shown, but is to be accorded the widest scope consistent with the principles and features disclosed herein.

Overview

Embodiments of the invention solve at least the technical problem of improving aesthetics of solar roof tiles at a low cost. A solar roof tile (or PV roof tile) can include a number of solar cells sandwiched between a front glass cover and a back cover. Due to manufacturing imperfections, the solar cells, and hence, the PV roof tiles, can have inherent color variations. Moreover, PV roof tiles can also have different color appearances under different lighting and/or at different viewing angles. To mitigate the color contrast, either within a PV roof tile or between PV roof tiles and non-PV roof tiles, in some embodiments, a robust color-management scheme is adopted while manufacturing the tiles. First, to reduce the color contrast within a PV roof tile, the PV roof tile can encapsulate polycrystalline-Si-based photovoltaic structures. By controlling the size and pattern of the surface texture of the polycrystalline-Si-based photovoltaic structures, one can reduce the "glow" of the photovoltaic structures. While keeping the front cover of the roof tile transparent, the back surface of the back cover can be coated with a layer of paint that matches the color of the textured surface of the photovoltaic structures to reduce the color contrast within the PV roof tile. A similar paint layer can also be deposited onto the back surface of the non-PV roof tiles. As a result, the color appearance of the PV and non-PV roof tiles can be quite similar. Moreover, when assembling the PV roof tiles, the embedded photovoltaic structures are fed into the production line following a predetermined color pattern such that a majority of PV roof tiles contains solar cells of a similar color and PV roof tiles of different colors are evenly or randomly mixed to prevent clustering of colors on a roof.

In alternative embodiments, one can also create PV roof tiles as well as non-PV roof tiles having significantly different surface colors by selectively treating the surface of their front glass covers. There are different ways of treating the front surface of the front glass cover, such as surface texturing or coating. By randomly placing roof tiles, either PV or non-PV tiles, of different colors on the roof, one can distract a viewer from noticing the color difference between PV and non-PV tiles. The resulting roof is also more aesthetically pleasing.

A "solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," "smaller cell," or "strip" is a portion or segment of a photovoltaic structure, such as a solar cell. A photovoltaic structure may be divided into a number of strips. A strip may have any shape and any size. The width and length of a strip may be the same or different from each other. Strips may be formed by further dividing a previously divided strip.

"Finger lines," "finger electrodes," and "fingers" refer to elongated, electrically conductive (e.g., metallic) electrodes of a photovoltaic structure for collecting carriers.

"Busbar," "bus line," or "bus electrode" refer to elongated, electrically conductive (e.g., metallic) electrodes of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or a solar cell strip. A photovoltaic structure is not limited to a device fabricated by a particular method. For example, a photovoltaic structure can be a crystalline silicon-based solar cell, a thin film solar cell, an amorphous silicon-based solar cell, a polycrystalline silicon-based solar cell, or a strip thereof.

PV Roof Tiles with Color Matching and Randomization

A PV roof tile (or solar roof tile) is a type of PV module shaped like a roof tile and typically enclosing fewer solar cells than a conventional solar panel. Note that such PV roof tiles can function as both PV cells and roof tiles at the same time. PV roof tiles and modules are described in more detail in U.S. patent application Ser. No. 15/909,181, entitled "SYSTEM AND METHOD FOR PACKAGING PHOTOVOLTAIC ROOF TILES" filed Mar. 1, 2018, which is incorporated herein by reference.

FIG. 1 shows an exemplary configuration of PV roof tiles on a house. PV roof tiles 100 can be installed on a house like conventional roof tiles or shingles. Particularly, a PV roof tile can be placed with other tiles in such a way as to prevent water from entering the building.

A PV roof tile can enclose multiple solar cells or PV structures, such as monocrystalline-Si-based solar cells. However, although monocrystalline-Si-based solar cells can provide superior energy-conversion efficiency, they can suffer from high color flop, especially those with <111> pyramid surface texturing. In addition to color flop, the monocrystalline-Si-based solar cells can also produce a "cell glowing" appearance (i.e., the surface of the solar cells may demonstrate a strong mirroring refection under certain lighting conditions), making it difficult to find a common material that can match the color appearance of these solar cells. As a result, there is a significant difference in appearance between PV tiles and non-PV tiles.

One existing solution for reducing such a difference is to embed dummy Si wafers into non-PV tiles. However, such a solution is expensive and the resulting roof aesthetic is less than ideal. To improve the color appearance of a solar roof (e.g., a roof having a mixture of PV and non-PV tiles), some embodiments of the present invention employ a number of color-control schemes, including a color-matching scheme, a color randomization scheme, and a combination of both.

In some embodiments, instead of monocrystalline-Si-based solar cells, the PV roof tiles can include polycrystalline-Si-based solar cells. The surface of a polycrystalline-Si-based solar cell can be textured using a reactive ion etching (RIE) technique. In further embodiments, the feature size of the RIE-textured surface can be less than 1 micron (i.e., 0.5 micron or less). In alternative embodiments, the surface of the solar cells can have pyramid texturing with the base width of the pyramids being less than 1 micron (e.g., 0.7 micron or less). Compared to the textured surface of a monocrystalline-Si-based solar cell, the RIE-textured surface of the polycrystalline-Si solar cells can have improved surface uniformity. As a result, the PV roof tiles can have reduced color flop and glow.

In alternative embodiments, reducing the cell glow can be achieved through specifically designed anti-reflection coating. This specially designed anti-reflective coating (AR) on a monocrystalline-Si-based solar cell surface can include materials with a higher refractive index than a conventional AR coating (e.g., an indium tin oxide (ITO) coating). More precisely, the specifically designed AR coating can include a layer of $SiN_x$ or a $SiO_xN_y/SiN_y$ double layer structure. As a result, the cell glow can be reduced by three- to eightfold with low (e.g., less than 5%) power loss.

Figure 2:
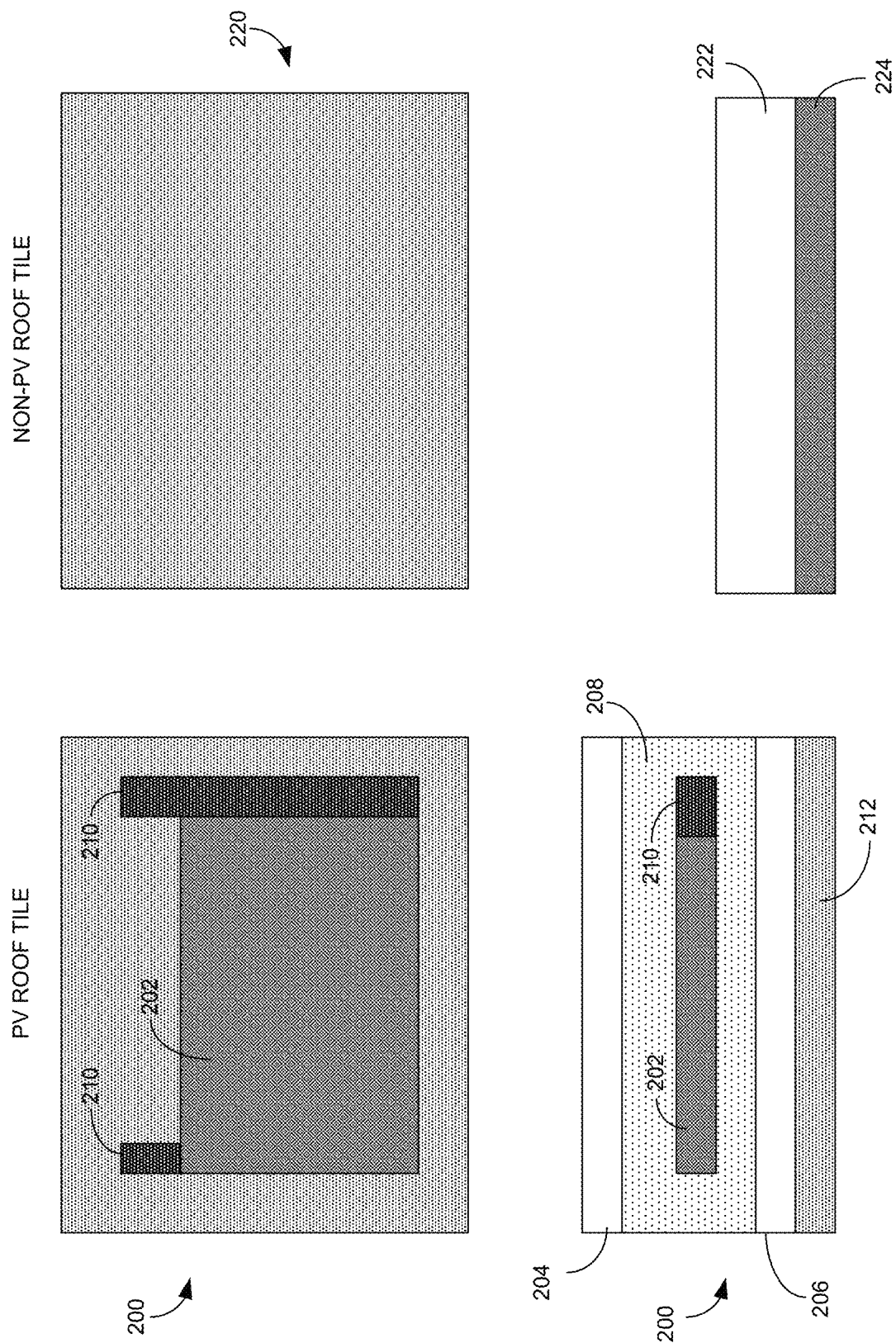
FIG. 2 shows the top and cross-sectional views of an exemplary photovoltaic roof tile and an exemplary non-photovoltaic roof tile, according to an embodiment.

FIG. 2 shows the top and cross-sectional views of an exemplary photovoltaic roof tile and an exemplary non-photovoltaic roof tile, according to an embodiment. The left drawings show the top view (the upper left) and the cross-sectional view (the lower left) of a PV roof tile, and the right drawings show the top view (the upper right) and the cross-sectional view (the lower right) of a non-PV roof tile.

PV roof tile 200 can include a solar cell or array of solar cells 202 encapsulated between a top glass cover 204 and a back glass cover 206 by an encapsulant layer 208. In some embodiments, solar cell or cells 202 can include a string of shingled photovoltaic strips, with each strip being a fraction of a standard square or pseudo-square solar cell. Top glass cover 204 can include fortified or tempered glass, and the front surface (i.e., the sun-facing surface) of top glass cover 204 can be textured to provide a desired visual appearance. Back glass cove 206 can include fortified or tempered glass, or a regular PV backsheet. In some embodiments, the thickness of top glass cover 204 can be between 2 and 3 mm (e.g., 2.7 mm). Similarly, the thickness of back glass cover 206 can be between 2 and 3 mm (e.g., 2.5 mm). Unlike top glass cover 204, back glass cover 206 can have smooth surfaces. Encapsulant layer 208 can be based on a polymer, which can include but is not limited to: polyvinyl butyral (PVB), thermoplastic polyolefin (TPO), ethylene vinyl acetate (EVA), or N,N'-diphenyl-N,N'-bis(3-methylphenyl)-1, 1'-diphenyl-4,4'-diamine (TPD). One or more metallic electrodes (e.g., electrodes 210) can also be encapsulated between front cover 204 and back cover 206. Electrodes 210 can facilitate electrical coupling between adjacent PV roof tiles.

To achieve a near uniform color appearance within a PV roof tile, in some embodiments, PV roof tile 200 can include, on the outer surface of back cover 206, a paint layer 212. Paint layer 212 can include a polymer-based paint, such as OPACI-COAT-300® of Industrial Control Development, Inc., of Ridgefield, Wash. The color of paint layer 212 can be carefully selected to match the color of the embedded solar cells. If the color of paint layer 212 matches the color of the solar cell(s) embedded in the PV tile, when viewed from a place above top glass cover 204, PV roof tile 200 can exhibit a substantially uniform appearance, with the solar cells blending into the background color. Note that, due to variations in thickness of the anti-reflective coating (ARC) layer on the surface of the solar cells, different solar cells (or strings of shingled strips) may exhibit different colors (e.g., different shades of blue). The color of paint layer 212 can be designed to match the color of the particular solar cell or solar cells encapsulated within PV roof tile 200.

Because paint layer 212 is on the outside (or back) surface of back cover 206, the tile fabrication process can be much simpler than that of a conventional PV roof tile that requires applying a paint layer on the inside surface of back cover 206. More specifically, one can complete the fabrication of individual PV roof tiles or tile modules, group the tiles or tile modules into different groups based on their color, and then apply a layer of paint with a matching color on the back covers. Such a process can be independent of the fabrication process of the tiles or tile modules. In some embodiments, the PV roof tiles can be grouped into two to three color groups based on the surface color of the embedded solar cells.

Non-PV roof tile 220 can include a glass layer 222 and a paint layer 224. Glass layer 222 can include fortified or tempered glass, and the front surface of glass layer 222 can be textured. The surface texture of glass layer 222 of non-PV roof tile 220 can be similar to the surface texture of top glass cover 204 of PV roof tile 200 in order to ensure a similarity in appearance between the PV roof tiles and the non-PV roof tiles. The thickness of glass layer 222 can be between 4 and 6 mm (e.g., 5 mm). In some embodiments, the thickness of glass layer 222 can be substantially similar to the total thickness of top glass cover 204 and back glass cover 206 of PV roof tile 200 to ensure that PV roof tiles and non-PV roof tiles can have similar thicknesses.

Paint layer 224 can be similar to paint layer 212. In some embodiments, the color of paint layer 224 can be similar to the color of paint layer 212. More particularly, if the PV roof tiles have been grouped into two or three different color groups, paint layer 224 of the non-PV roof tiles can have two or three different colors that are similar to the colors of the PV roof tiles. In other words, like the PV roof tiles, the non-PV roof tiles can have different colors and can be grouped into the same two or three color groups. Alternatively, each cell color can have multiple corresponding background colors (e.g., colors of paint layer 224) to mimic the color variation among the solar cells.

Figure 3:
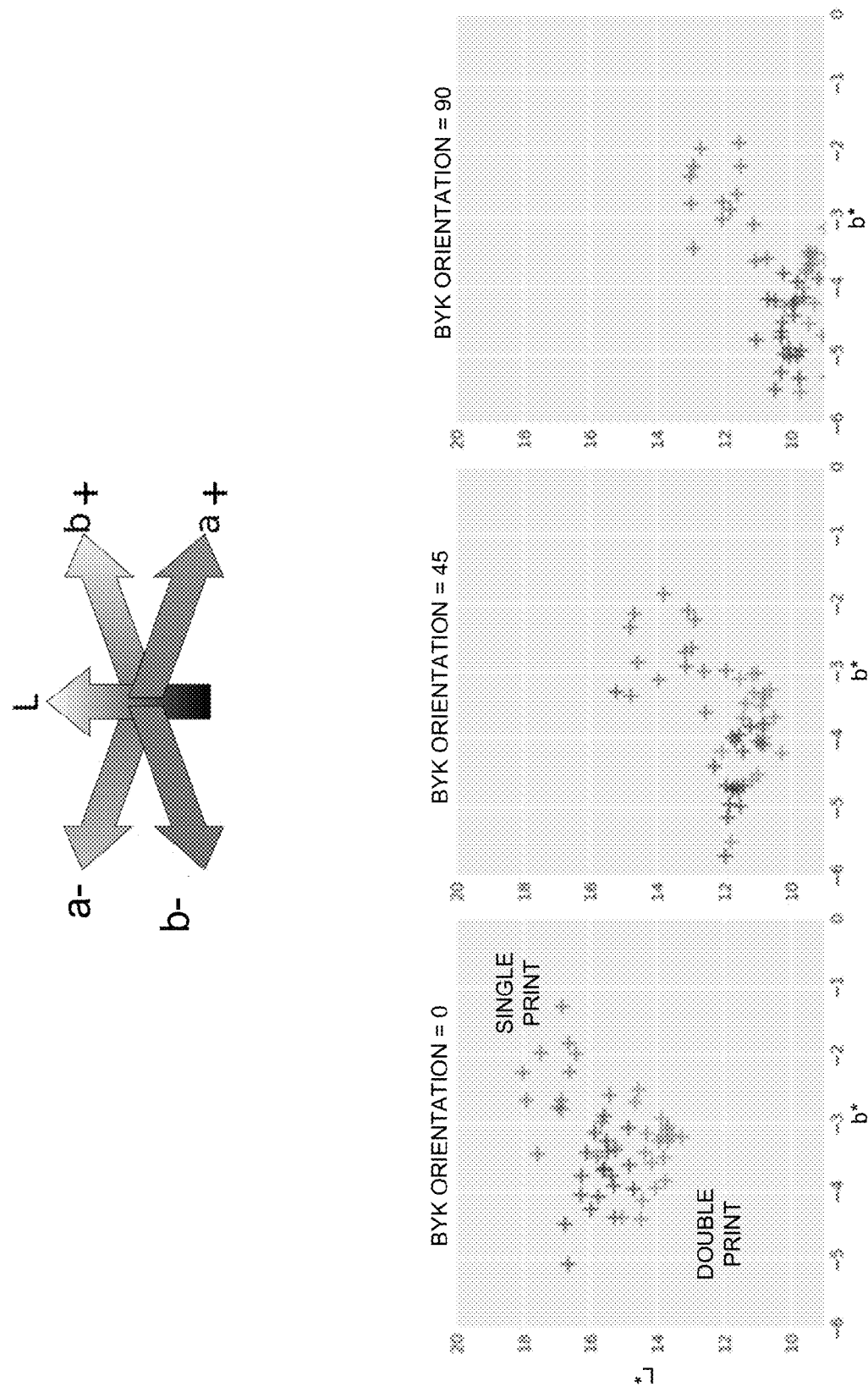
FIG. 3 shows exemplary color distribution of PV roof tiles containing polycrystalline-Si-based solar tiles, according to one embodiment.

FIG. 3 shows exemplary color distribution of PV roof tiles containing polycrystalline-Si-based solar tiles, according to one embodiment. The top drawing shows the LAB color space, where the L*a*b color values provide a way to locate and communicate colors the same way geographic coordinates (e.g., longitude, latitude, and altitude) are used to indicate geographic locations. In the LAB space, "L*" stands for lightness, "a*" stands for red/green value, and "b*" stands for blue/yellow value. The L* axis runs vertically, where the bottom (L=0) indicates black or total absorption. The a* axis runs laterally, where a color measurement movement in the a+ direction depicts a shift toward red, and a color measurement movement in the a− direction depicts a shift toward green. The b* axis runs perpendicularly to the a* axis, where a color measurement movement in the b+ direction depicts a shift toward yellow, and a color measurement movement in the b− direction depicts a shift toward blue.

The bottom drawings show exemplary color distributions of polycrystalline-Si-based solar cells, according to one embodiment. More specifically, the bottom drawings show the lightness and blue/yellow values of the backscattered light measured at different angles (e.g., 0°, 45°, and 90°) for a number of solar cells. Note that 0° means that the color is measured at a direction perpendicular to the grid lines, whereas 90° means that the color is measured at a direction parallel to the grid lines. Some solar cells (e.g., single print cells) have wider (e.g., 70 microns) gridlines, and some solar cells (e.g., double print cells) have thinner (e.g., 40 microns) gridlines. From FIG. 3, one can see that the solar cells with thinner gridlines are darker and bluer than solar cells with wider gridlines.

Figure 4:
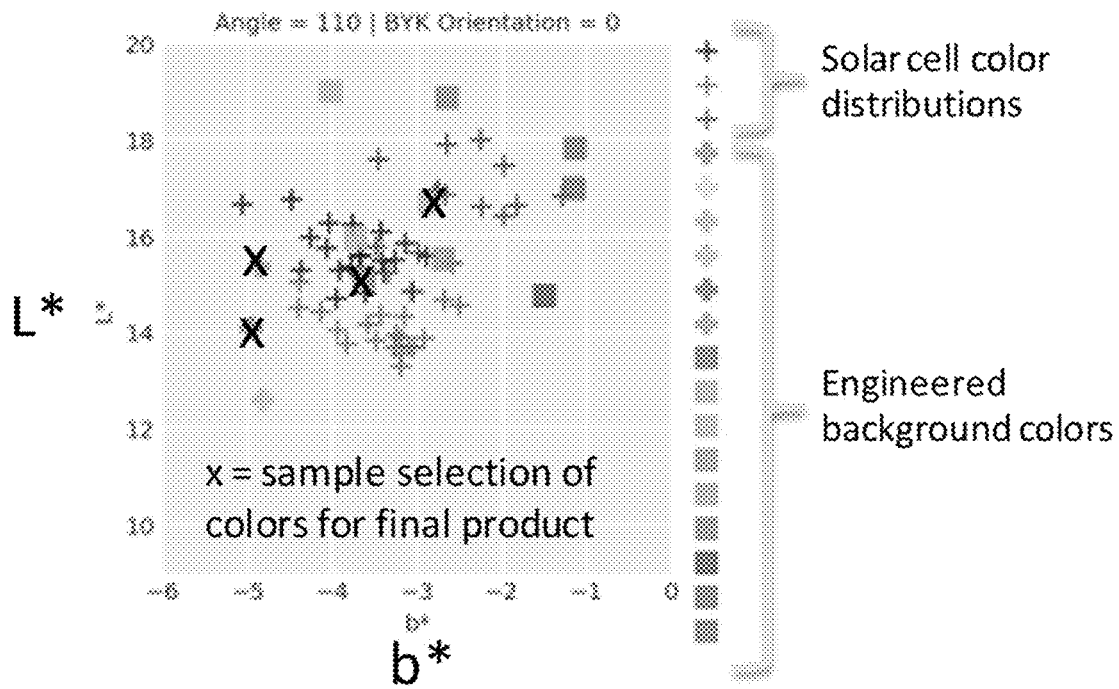
FIG. 4 illustrates the comparison between a number of custom-designed background colors and solar cell colors, according to one embodiment.

Once the color of the solar cells is measured (e.g., using a spectrophotometer), one can custom design the background or the paint color that can match the cell colors. FIG. 4 illustrates the comparison between a number of custom-designed background colors and solar cell colors, according to one embodiment. In this example, the backscattered light is measured at 0°. The "X"s indicate the selected background colors that can provide a good color match. By carefully matching the background color (i.e., the color of the paint layer) with the cell color, one can successfully hide the appearance of the solar cells within the PV roof tile. In some embodiments, the non-PV tiles can include a paint layer with similar custom-designed colors to mimic the appearance of the PV tiles. Moreover, because the solar cells do not have a uniform color, up to three different custom-designed paint colors can be applied on different non-PV tiles to mimic the color variation of the solar cells.

In some embodiments, a PV roof tile can include a string of shingled photovoltaic strips, and the photovoltaic strips are obtained by dividing standard square solar cells into multiple segments. For example, each shingled string can include six photovoltaic strips, which can be obtained from two standard square solar cells. Fabricating a shingled string can include fetching square solar cells, dividing the square solar cells into smaller strips, and arranging the smaller strips into a shingled string. If the two solar cells, from which the strips of a shingled string are obtained, have two different colors, different portions of the photovoltaic string may exhibit different colors, making it difficult to select a background color (i.e., the color of the paint layer on the bottom of the back cover of the PV roof tile).

Figure 5:
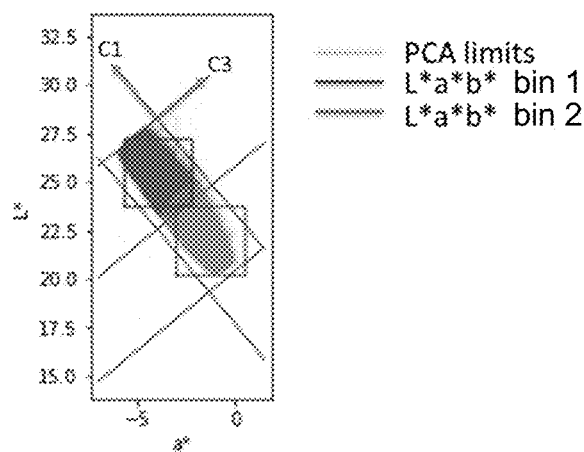
FIG. 5 shows the grouping of solar cells having different colors, according to one embodiment.

To solve this problem, in some embodiments, during the fabrication of the PV roof tiles, special care can be taken for color management of the PV roof tiles. More specifically, the square solar cells can be grouped into two groups based on their color. Solar cells having a similar color can be grouped together and placed into a same bin. In some embodiments, color measurements can be performed on the solar cells prior to these solar cells being divided into smaller strips. More specifically, the color of the solar cells can be measured according to the CIE (the International Commission on Illumination) standards, and the solar cells can be grouped according to the measurement results. FIG. 5 shows the grouping of solar cells having different colors, according to one embodiment. More specifically, FIG. 5 shows the L*a*b* values of the solar cells, where X axis indicates the a* value, the Y axis indicate the L* value, and the color indicates the b* value. Each point can represent a solar cell. In FIG. 5, the solar cells can be grouped into two bins as indicated by the red and green boxes based on their L*a*b* measurements. More specifically, the grouping is done along a principle axis direction of the color variation (e.g., axis C1 shown in FIG. 5).

During the fabrication of the PV roof tiles, solar cells from the two different bins can be fed to the assembly line according to a predetermined pattern. For example, five solar cells from one bin can be fed into the assembly line followed by three solar cells from the other bin. The same pattern can repeat itself or be followed by other predetermined patterns. In some embodiments, in addition to the 5:3 pattern, the solar cells can also be fed into the assembly line using a 4:4 pattern (i.e., four cells from one bin followed by four cells from the other bin) or a 3:5 pattern (i.e., three cells from one bin followed by five cells from the other bin). This arrangement can ensure that a majority (e.g., 75%) of fabricated PV tiles have a single cell color, meaning that the two cells in a PV tile have the same color.

Figure 6:
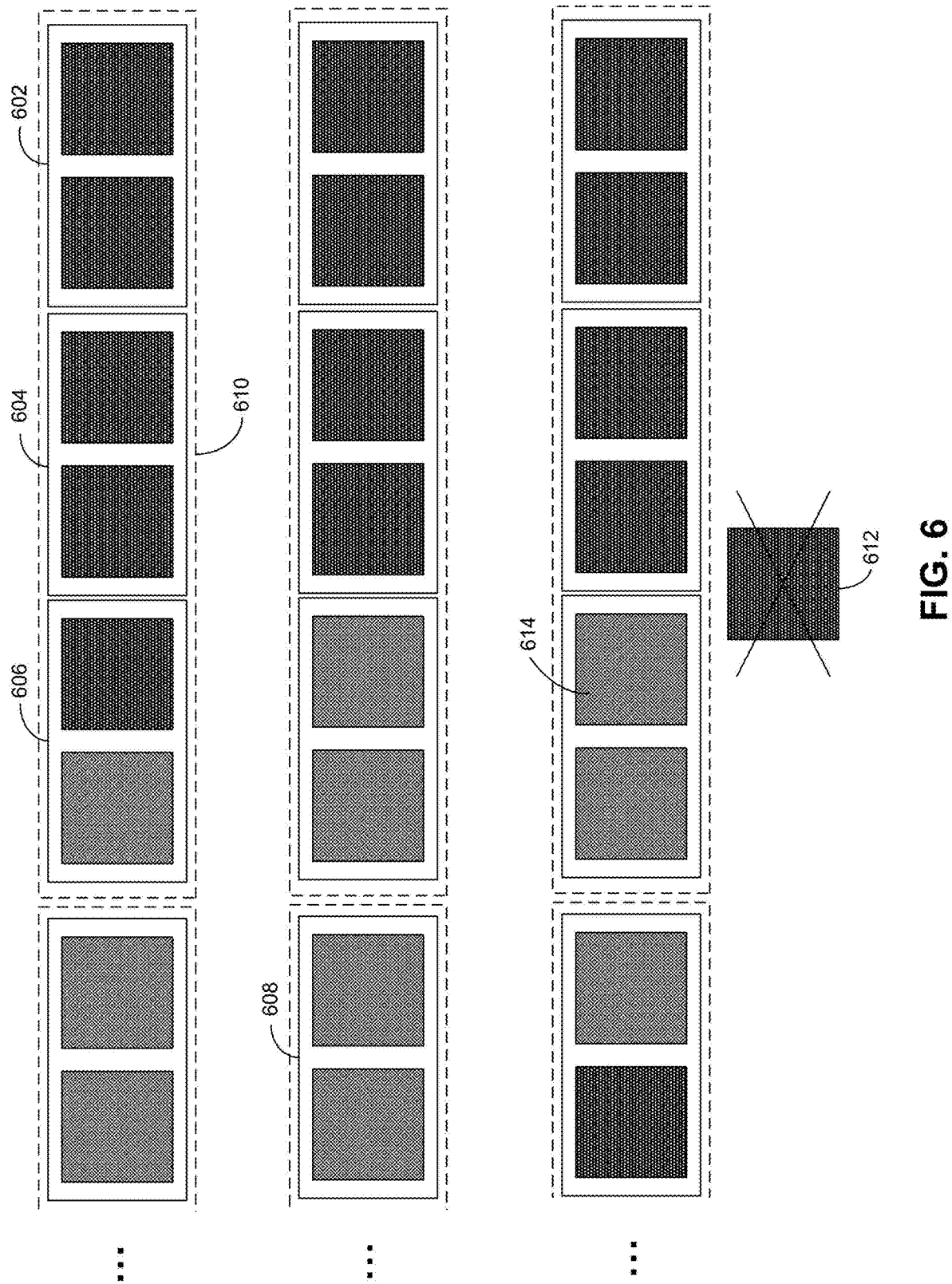
FIG. 6 demonstrates various cell-arrangement patterns, according to one embodiment.

FIG. 6 demonstrates various cell-arrangement patterns, according to one embodiment. The top row shows a 5:3 pattern where five solar cells from a first bin, which holds solar cells of similar colors, are fed to the assembly line followed by three solar cells from a second bin. As one can see, the eight solar cells can be embedded into four PV tiles, with three PV tiles having a single cell color (e.g., PV tiles 602 and 604) and one tile (e.g., tile 606) having a mixed cell color. The middle row shows a 4:4: pattern, where four solar cells of one color are followed by four solar cells of a different color. In this scenario, all four PV roof tiles (e.g., tile 608) have a single cell color.

The bottom row of FIG. 6 shows a scenario where a solar cell is broken during fabrication. More specifically, solar cell 612 is broken and removed from the assembly line. As a result, a next in line solar cell (e.g., solar cell 614) takes the place of solar cell 612 in the assembly line. The resulting four PV roof tiles have three tiles with a single cell color and one tile with a mixed cell color. As one can see from FIG. 6, even in the event of cell breakage, the majority of the PV tiles can have a single or uniform cell color.

In some embodiments, multiple PV tiles can be assembled to form a PV tile module. In the example shown in FIG. 6, tiles 602, 604, and 606 form a tile module 610. Note that the color mixing in a tile module (such as the examples shown in the lower two rows of FIG. 6) does not negatively affect the aesthetics of the roof.

Once the PV roof tile modules are fabricated, they can be randomly distributed over the desired area (e.g., the area that receives most direct sunlight) on a roof. More specifically, the tile modules can be randomly mixed for an installer to install. During installation, the installer can just pick up tile modules to place on the roof without needing to consider the color of each individual module. Similarly, the non-PV roof tiles having different colors can also be randomly mixed and installed onto the roof at locations that do not receive sufficient sunlight. In practice, the non-PV roof tiles are typically located at edges of the roof, creating a background for the PV roof tiles.

Figure 7:
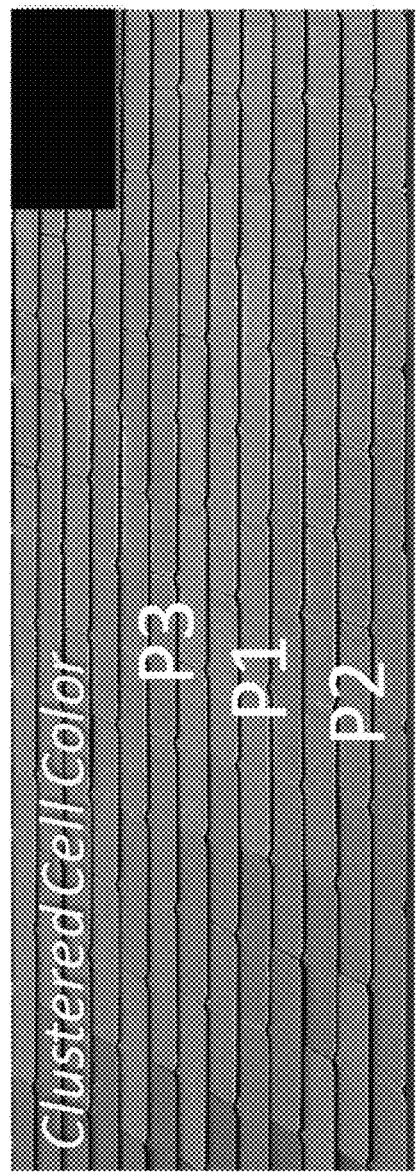
FIG. 7 shows the example of a roof having clustered cell colors.

By randomly mixing and placing the PV tiles with different cell colors and by creating a background having a randomized color distribution, embodiments of the present invention can prevent the color cluster phenomenon, where PV tiles of similar colors are clustered together. FIG. 7 shows the example of a roof having clustered cell colors. In the example shown in FIG. 7, three different color clusters (e.g., clusters P1, P2, and P3) are shown, creating an undesired roof aesthetic.

Figure 8A:
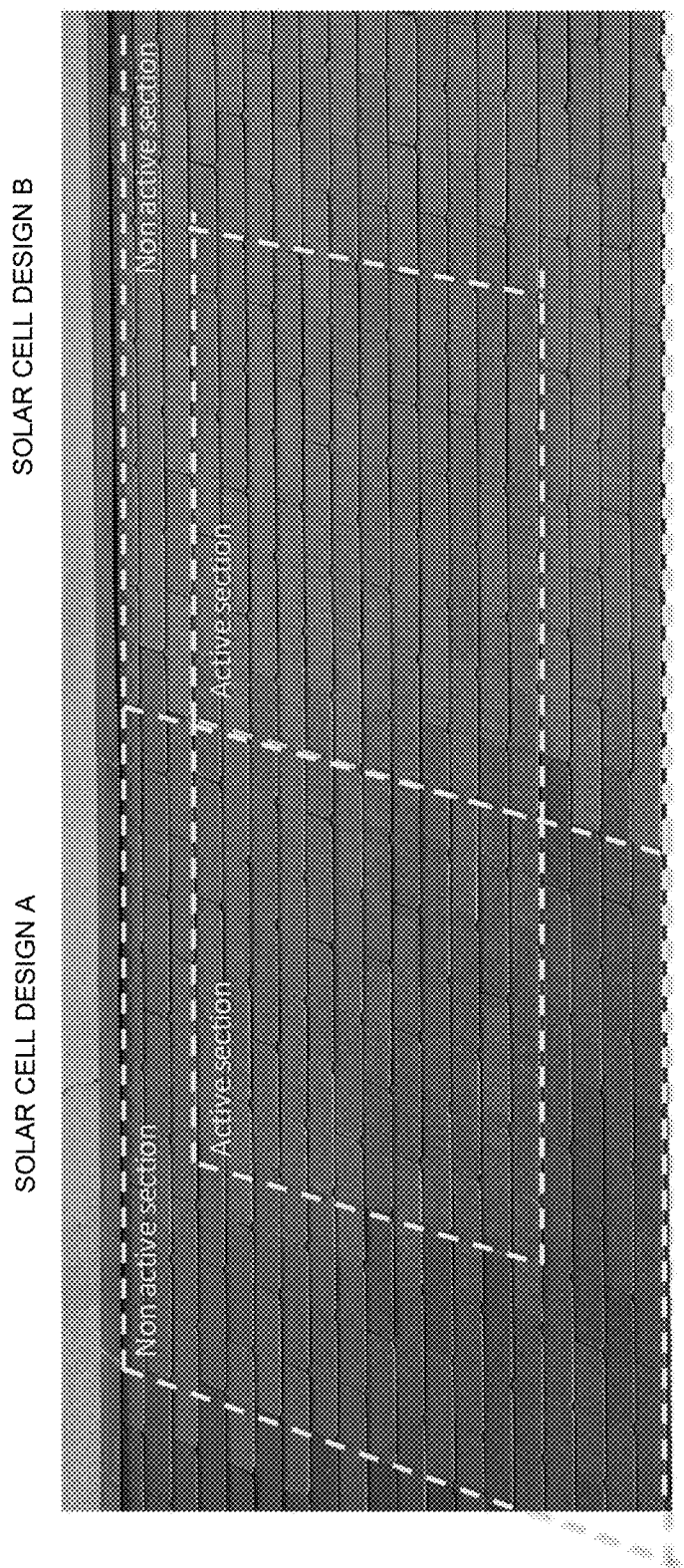
FIG. 8A shows the color distribution on a solar roof for two different solar cell designs, according to one embodiment.

On the other hand, when PV roof tiles having different colors are randomly distributed, a more consistent color appearance can be provided. More specifically, the mixing schemes shown in FIG. 6 can ensure that the color distribution across the roof is homogenous. Moreover, the carefully designed background color also makes it very difficult to identify solar cells from the ground across a broad range of lighting conditions. FIG. 8A shows the color distribution on a solar roof for two different solar cell designs, according to one embodiment.

In FIG. 8A, the left half of the roof shows a solar cell design with darker or bluer solar cells and the surrounding non-PV cells are also configured to match the color of these cells. Similarly, the right half of the roof shows a solar cell design with lighter color solar cells and the surrounding non-PV cells are also configured to match the lighter color solar cells. Note that, although individual PV roof tiles in each section may still demonstrate different colors, when viewed as a whole, each roof section can present a substantially uniform color appearance.

Figure 8B:
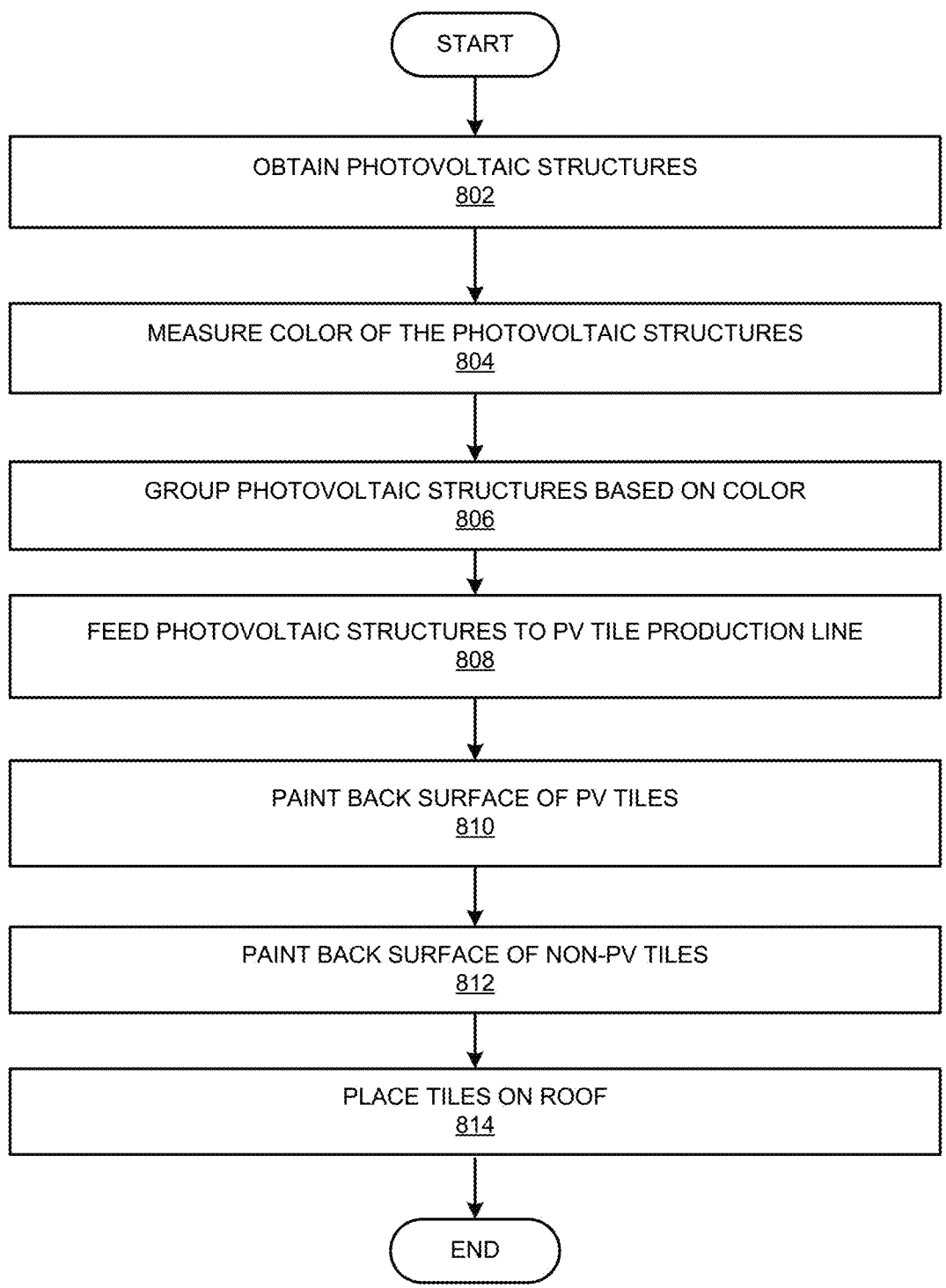
FIG. 8B presents a flowchart illustrating an exemplary process for manufacturing a photovoltaic roof, according to an embodiment.

FIG. 8B presents a flowchart illustrating an exemplary process for manufacturing a photovoltaic roof, according to an embodiment. During operation, a number of photovoltaic structures (e.g., standard six-inch square or pseudo-square solar cells) are obtained (operation 802) and the color (e.g., $L^*a^*b^*$ values) of the photovoltaic structures is measured (operation 804). The photovoltaic structures can then be placed into a number (e.g., two) of separate bins based on their color (operation 806). The photovoltaic structures can then be fed to the PV tile production line based on a predetermined pattern (operation 808). For example, a predetermined number of photovoltaic structures can come from a first bin followed by a predetermined number of photovoltaic structures from a second bin. This approach ensures that the majority of the tiles contain solar cells of a similar color. In some embodiments, the PV tile production line can include processing tools for dividing the standard solar cells into smaller strips, for forming a cascaded string of the smaller strips, and for encapsulating the strings between glass covers. The scope of this invention is not limited by the actual process used for producing the PV roof tiles. Any suitable techniques and designs can be implemented. In further embodiments, multiple (e.g., three) tiles can be assembled to form a tile module.

Subsequent to completing the encapsulation of the solar cells, the back surface of the PV roof tiles can be decorated or painted using a color that is designed to mimic the color of the photovoltaic structures (operation 810). In some embodiments, a polymer-based paint, such as OPACI-COAT-300®, can be used to paint the back glass surface of the PV roof tiles. A similar paint can also be used to paint the back surface of the non-PV tiles (operation 812), which can be a single piece of textured glass. In some embodiments, the color used on the non-PV tiles can be custom designed to mimic the color of the solar cells. Moreover, a number of paint colors of varying shades of a particular cell color can be used to paint the non-PV tiles in order to mimic the color variation of the solar cells.

The PV tiles/modules and non-PV tiles/modules can then be placed on the roof (operation 814). Because solar cells of different colors have been pre-mixed during the production of the PV tiles/modules, it is no longer necessary for the installers to pay attention to color mixing or to follow a particular installation order when installing the PV tiles/modules. Similarly, the non-PV tiles of different colors can be pre-mixed randomly. Therefore, during installation, the roof installer only needs to install the PV and non-PV tiles at their respective designed locations. The resulting roof will have a substantially isotopic or uniform color distribution, as shown in FIG. 8A.

Tile-To-Tile Glass Contrast Randomization

In some embodiments, one can deliberately create significant appearance contrasts among solar roof tiles and then by randomly distributing these highly contrasted tiles on the roof, one can hide or mask the difference between the PV tiles and the background non-PV tiles.

More specifically, in some embodiments, a fraction of the PV roof tiles and non-PV roof tiles can go through a particular appearance-changing procedure such that these changed PV and non-PV roof tiles can appear to have a significantly lighter color than others. The color contrast between the changed and unchanged tiles can be significantly larger than possible color variation between the PV and non-PV roof tiles.

Figure 9:
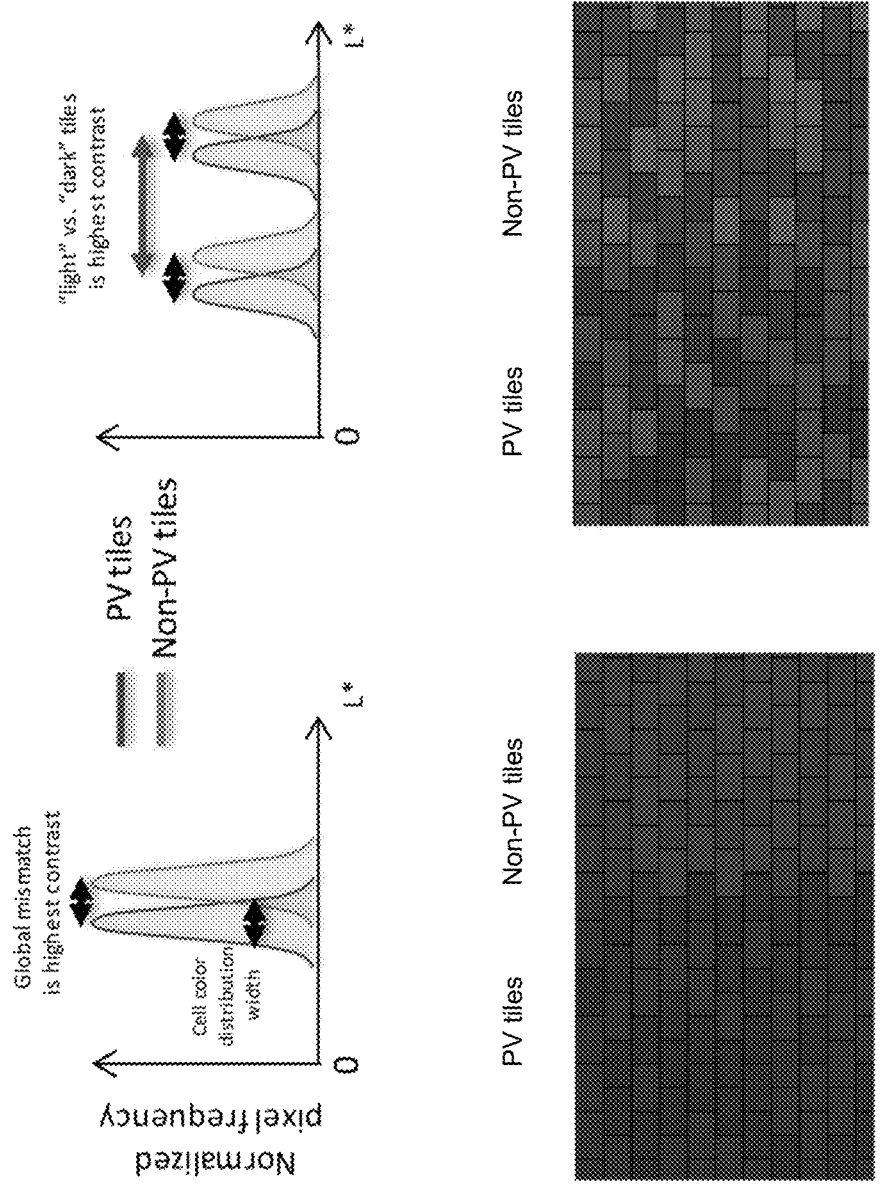
FIG. 9 shows the color histogram of PV and non-PV roof tiles, according to one embodiment.

FIG. 9 shows the color histogram of PV and non-PV roof tiles, according to one embodiment. The upper left drawing shows the color distribution of unchanged tiles, including both PV and non-PV roof tiles. As one can see, the color variation among the PV or non-PV tiles can be smaller than the color variation between PV and non-PV tiles. As a result, the color difference between the PV and non-PV roof tiles dominates the color effect of the solar roof as shown in the lower left drawing. Because PV and non-PV roof tiles are often clustered, this color contrast can create unpleasant roof aesthetics.

The upper right drawing shows the color distribution of a roof including both unchanged (darker) and changed (lighter) tiles. As one can see, although the color distribution within each group (e.g., unchanged PV tiles, unchanged non-PV tiles, changed PV tiles, and changed non-PV tiles) remains similar, the difference in color (or the color contrast) between the changed and unchanged tiles is much larger than the other color variations (e.g., the color variation between PV and non-PV tiles). Therefore, the color contrast between the darker, unchanged tiles and the lighter, changed tiles dominates the color effect of the roof, as shown in the lower right drawing of FIG. 9, with half of the tiles being treated to have a lighter color. As one can see from the drawing, it is much harder to tell the difference between the PV roof tiles and the non-PV roof tiles.

Figure 10:
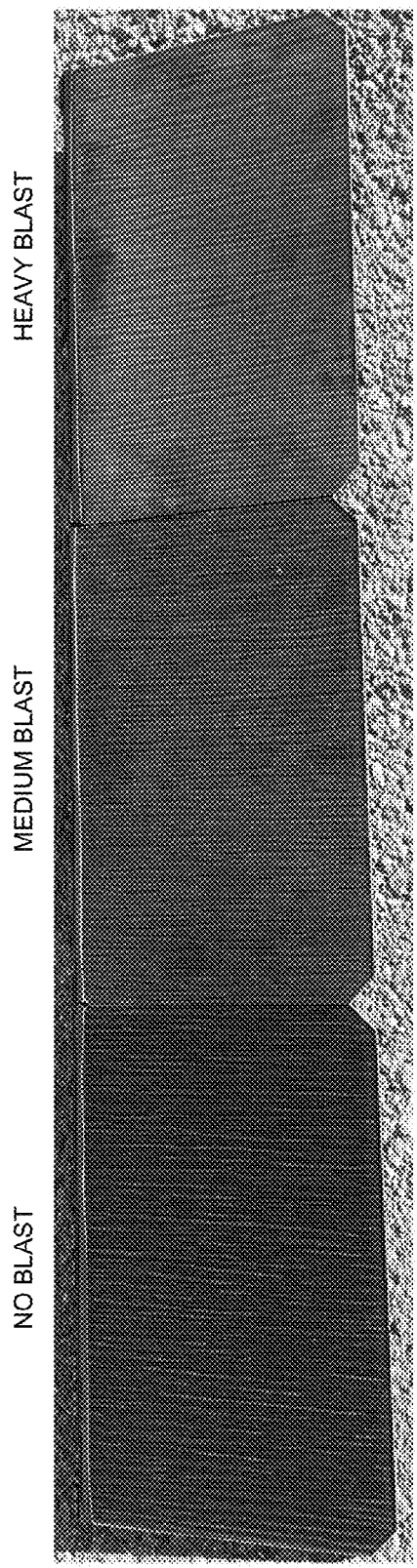
FIG. 10 shows the surface of roof tiles resulting from different surface etching conditions, according to one embodiment.

Etching the glass surface of the roof tiles (PV or non-PV) can create roof tiles with lighter colors. In some embodiments, a physical surface etching technique (e.g., sand blasting) can be used to modulate the surface color of the tiles. More specifically, by adjusting the etching parameters (e.g., blasting media and duration), one can achieve continuous shades of lightness. FIG. 10 shows the surface of roof tiles resulting from different surface etching conditions, according to one embodiment. The leftmost tile did not go through any surface etching and has the darkest color. The middle tile went through a medium sand blast procedure (e.g., the sand blast lasted for about 60 seconds), and the rightmost tile went through a heavy sand blast procedure (e.g., the blast lasted for about 120 seconds). One can see that the heavier the blasting, the lighter the color.

Figure 11:
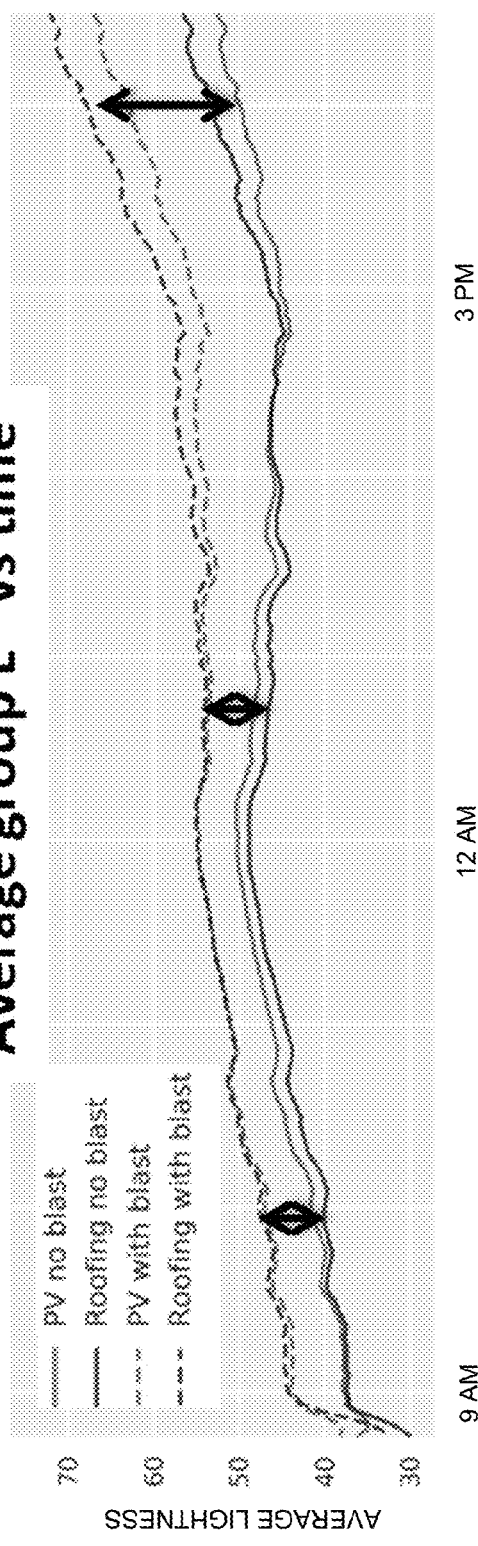
FIG. 11 shows the average lightness of the tiles as a function of time of day, according to one embodiment.

Measurement has shown that the tile-to-tile color contrast between blasted and non-blasted tiles can remain significant at any time of the day, including in conditions of an overcastted sky. FIG. 11 shows the average lightness of the tiles as a function of time of day, according to one embodiment. In FIG. 11, the color contrast between the blasted and non-blasted tiles for different times of day (e.g., morning, noon, or afternoon) are shown by the double arrows. As one can see from FIG. 11, such a color contrast remains significantly larger than the color contrast between PV and non-PV roof tiles for different times of day. More specifically, in the late afternoon, the color contrast between the PV and non-PV roof tiles increases, with the PV tiles being much darker than the non-PV tiles. However, because the difference in lightness between the blasted and non-blasted tiles also increases, such a contrast can remain the dominant color effect on the roof.

Other surface etching technologies, such as chemical etching, can be used to create the desired color effect. In addition to surfacing etching, a thin-film coating technology can also be used to change the color appearance of the roof tiles, thus creating desired tile-to-tile color contrast. More specifically, by varying the thickness of a thin-film coating on the glass surface, one can sufficiently vary the appearance of the tiles. In some embodiments, the glass surface (often textured) can be coated with a layer of $SiN_x$, and by varying the thickness of the $SiN_x$ film, one can achieve different color lightening effects.

Figure 12:
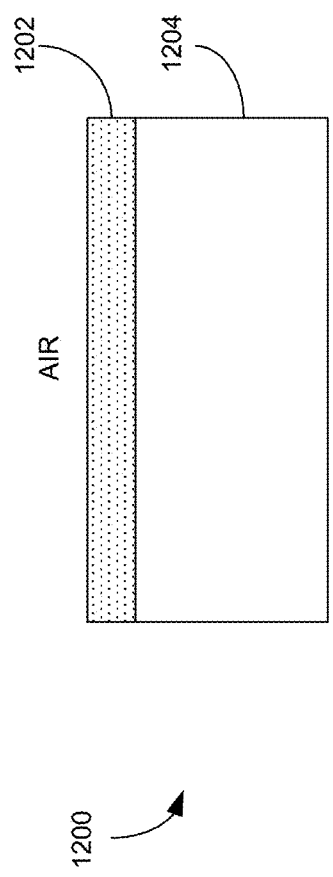
FIG. 12 shows the front glass cover of a roof tile, according to one embodiment.

FIG. 12 shows the front glass cover of a roof tile, according to one embodiment. Front glass cover 1200 can be the front cover of a PV roof tile or a non-PV roof tile. Front glass cover 1200 can include a glass substrate 1204 and a thin-film coating 1202. Depending on the usage (PV or non-PV), the thickness of glass cover 1200 can vary. In general, glass substrate 1200 used in the non-PV tiles can be thicker than the one used in the PV tiles to compensate for the thickness of the back cover and encapsulated solar cells.

Figure 13:
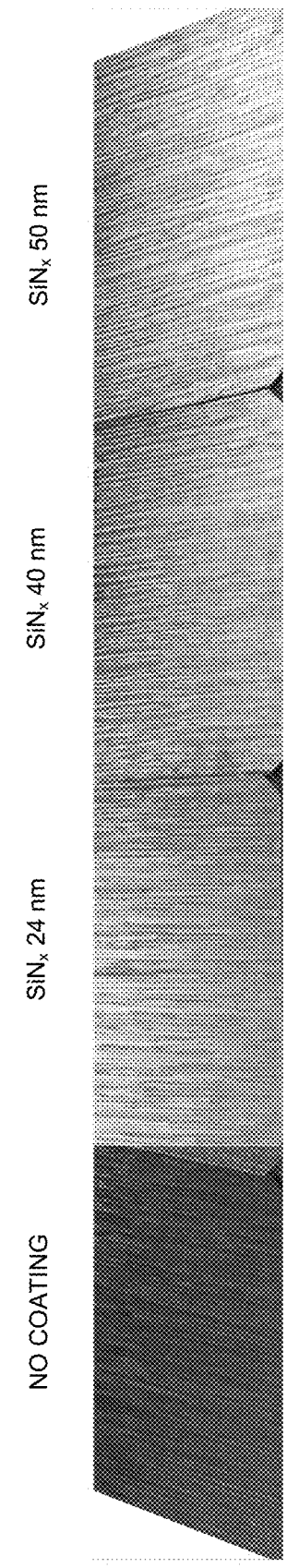
FIG. 13 shows the color effect of the thin-film coating with various thicknesses, according to one embodiment.
Figure 14:
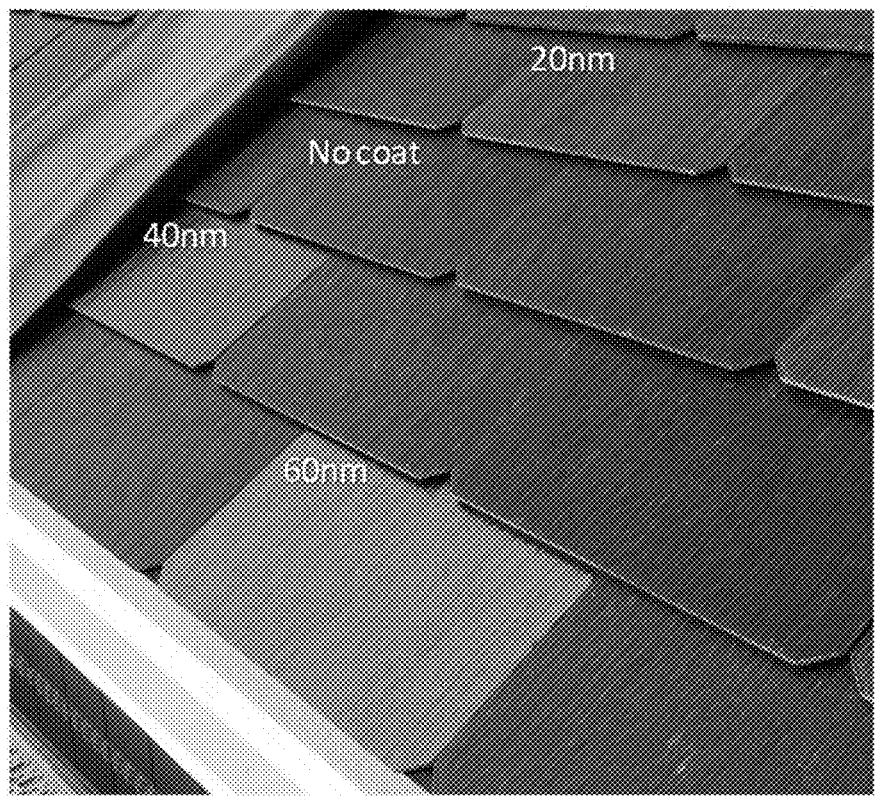
FIG. 14 shows a partial view of a roof having tiles with different thin-film coatings, according to one embodiment.

Thin-film coating 1202 can include a material having a refractive index that is higher than glass. In some embodiments, thin-film coating 1202 can include a layer of $SiN_x$, a layer of $SiON_x$, or a $SiN_x/SiON_x$ bi-layer. The thickness of thin-film coating 1202 can be between 1 and 100 nm, preferably between 10 and 50 nm. FIG. 13 shows the color effect of the thin-film coating with various thicknesses, according to one embodiment. More specifically, FIG. 13 shows, from left to right, a roof tile with no surface coating, a roof tile with a $SiN_x$ coating layer of 24 nm on its glass cover, a roof tile with a $SiN_x$ coating layer of 40 nm on its glass cover, and a roof tile with a $SiN_x$ coating layer of 50 nm on its glass cover. One can see the color of the coated roof tiles is lightened by various degrees compared to the non-coated roof tile. FIG. 14 shows a partial view of a roof having tiles with different thin-film coatings, according to one embodiment.

Figure 15:
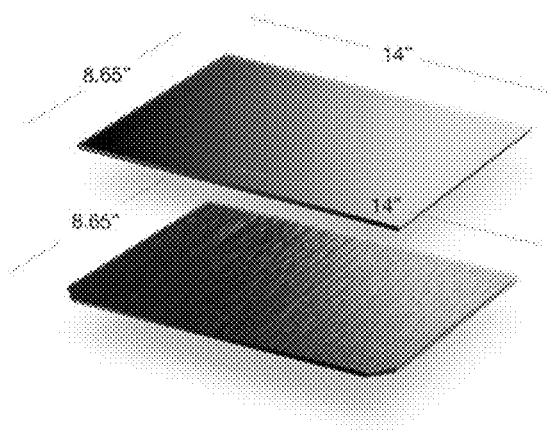
FIG. 15 shows the comparison between a smooth tile surface and a textured tile surface, according to one embodiment.

In addition to providing the ability to engineer color contrasts among roof tiles, the high index coating, when paired with rough surface microtexturing, can also be used to achieve a softer brushed metal look in cases where a smooth tile surface is desired. Note that, for tiles with a smooth surface, it is more aesthetically pleasing to mimic the appearance of the brushed metal surface than the harsh reflective metallic surface. FIG. 15 shows the comparison between a smooth tile surface and a textured tile surface, according to one embodiment. In FIG. 15, the upper tile has a relatively smooth surface and appears to have a lighter grey color than the bottom tile with a textured surface. To achieve the desired aesthetics, a roughening etching (e.g., chemical roughening etching or sand blasting) followed by a smoothing etching is needed to achieve a light scattering pattern similar to that of a brushed metal surface. The etched surface can then be coated with a high index thin-film coating, such as a $SiN_x$ coating having a thickness of 50 nm. $SiN_x$ coating is selected because it is non-absorbing. In fact, the amount of power loss due to the surface treatment (e.g., surface roughening plus thin-film coating) of the glass cover can be less than 10%.

Additional glass surface treatment methods for inducing tile-to-tile color contrast can also include microtexturing of the glass surface. More specifically, different micron textures (e.g., feature size between 10 and 1000 microns) can cause the tile surface to exhibit different levels of brightness or lightness at different viewing angles. The microtextures can superimpose conventional macrotextures on the glass surface.

FIG. 16A shows various exemplary microtexture patterns on a glass surface, according to one embodiment. More specifically, FIG. 16A shows four different texture patterns. For example, textures 1 and 2 each include diagonal (or 45°/135°) lines, texture 3 includes horizontal lines, and texture 4 includes slanted lines of a different angle. Note that the larger features shown in FIG. 16A are the result of conventional macrotextures (e.g., feature size greater than 1 mm) on the glass surface. More specifically, the lighter portions indicate the peaks of the macrotexture, whereas the darker portions indicate the valleys of the macrotexture. Note that the four texture patterns shown in FIG. 16A in fact have similar macrotexture patterns. FIG. 16A also shows that, for all four texture patterns, each valley of the macrotexture is micro-textured with vertical lines. The different microtexture patterns used in the peaks and valleys of the macrotexture can enhance the color contrast (light vs. dark) between the peaks and the valleys, thus enhancing the appearance of the macrotexture (e.g., the valleys may appear deeper). Note that, to further enhance the visual contrast between the peaks and the valleys of the macrotexture structure, the respective microtextures on the peaks and valleys not only differ in orientation (e.g., diagonal vs. vertical) but also differ in width (e.g., 400 microns for the peak vs. 150 microns for the valley).

FIG. 16B shows a partial view of the roof having tiles with different texture patterns, according to one embodiment. As one can see in FIG. 16B, although having similar macro patterns, the four different microtexture patterns can result in the tiles having different color appearances, with texture pattern 2 creating a significantly darker tile than the other three types of textures. This is in fact due to the difference in orientation of the microtexture lines. Similar to the example shown in FIG. 9, the tile-to-tile contrast among tiles with different texture patterns dominates the color effect of the roof. In some embodiments, the creation of the microtextures can be integrated with the creation of the microtextures. More specifically, the macrotexture of the glass is often achieved during the initial rolling or pressing of the glass sheet; and the microtexture can also be embedded in the glass roller or glass pressing mold. In other words, the pattern on the roller or pressing mold can include both the pattern for creating the macrotexture as well as the pattern for creating the desired microtexture. For example, the microtexture pattern can be superimposed on the macrotexture pattern.

In addition to creating an appearance or color contrast among tiles, this microtexturing technique can also create an appearance or color contrast within each single tile. The flexibility of creating patterns on the roller or pressing mold makes it easier to apply different microtexture patterns on different portions of a single piece of glass, thus resulting in different portions of the same tile having different color appearances.

FIGS. 17A-17B show exemplary scenarios of in-tile color contrast, according to one embodiment. The left drawing of FIG. 17A shows that a tile can be divided into two equal portions, with each portion having a particular microtexture pattern. The right drawing of FIG. 17A shows a partial view of a roof having such tiles randomly distributed. FIG. 17B shows that a tile can be divided into four equal portions, with different adjacent portions having different microtexture patterns. The right drawing of FIG. 17B shows a partial view of a roof having such tiles randomly distributed.

From FIGS. 17A-17B, one can see that the in-tile color contrast not only can randomize the color distribution, thus hiding the difference between PV and non-PV tiles, but also can create a visual effect of tiles having a different size than their original size. More specifically, the tiles can appear smaller than their real size. For example, in FIG. 17A, the tiles appear to be half the size of the real tile, and in FIG. 17B, the tiles appear to be a quarter of the size. In certain scenarios, the smaller tiles may be aesthetically favorable.

In addition to the appearance of different size tiles, applying different microtexture patterns on a single tile can also create an effect of tiles having different offsets. FIG. 18 shows a different scenario of in-tile color contrast, according to one embodiment. In FIG. 18, each tile can be divided into two portions of different sizes, and each portion can have a different microtexture pattern, as shown in the left drawing. The resulting roof, shown in the right drawing of FIG. 18, can produce a visual effect of smaller tiles having various offsets between adjacent rows. In general, the ability to modulate the tile color contrast within each tile can provide roof designers more options in designing the roof aesthetics.

Figure 19:
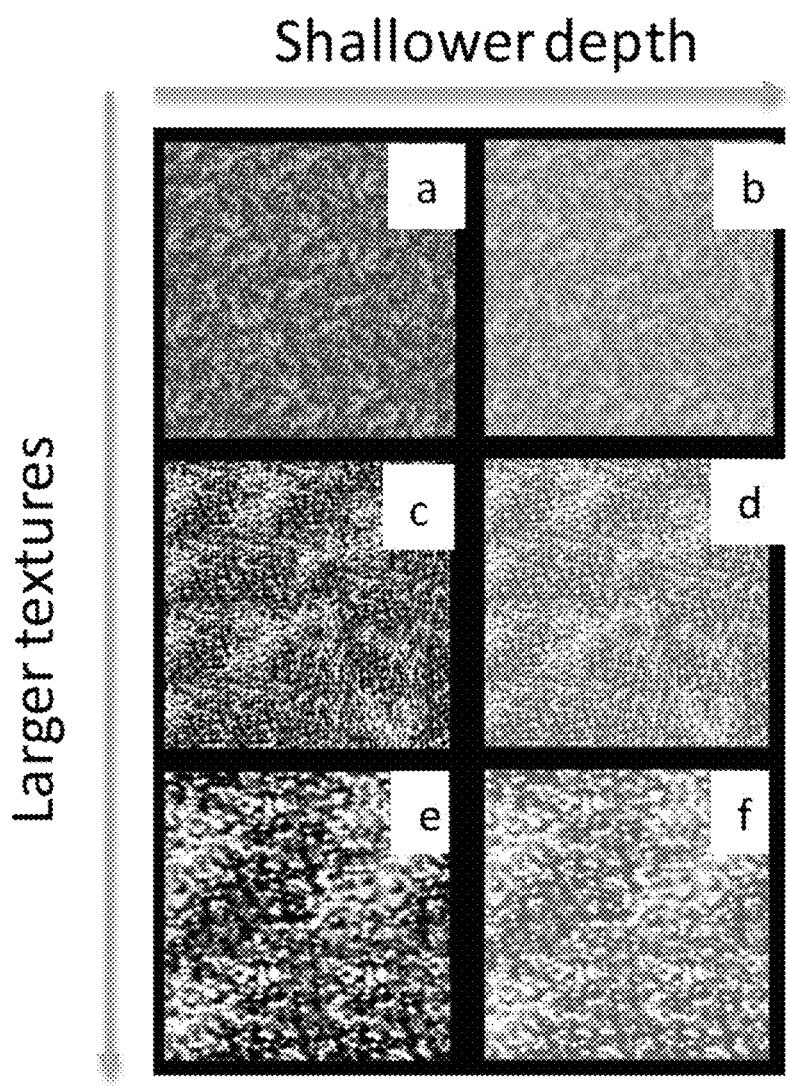
FIG. 19 shows a number of exemplary microscopic texture patterns, according to one embodiment.

In addition to the line patterns shown in FIG. 16A, other types of microscopic texture can also be used to achieve the roof color randomization, as long as features in different texture patterns scatter light differently, including different angles or strengths. In addition to lines of different orientations and/or widths, to create contrast, one can also use spheres of different scales or depths. FIG. 19 shows a number of exemplary microscopic texture patterns, according to one embodiment. In FIG. 19, from top to bottom, the size of the features increases; and for the same feature size, the feature pattern on the right side has a shallower depth than the feature pattern on the left side. By applying different micro features on the glass cover, one can modulate the color appearance (e.g., the lightness) of the tiles, including both the PV and non-PV tiles.

Although the rollers and press molds can be used to create the macrotexture pattern superimposed with a microtexture pattern on the glass surface, there are challenges to implementing such techniques. First, because the front covers of the PV tiles can be relatively thin (e.g., 2.7 mm), the overall depth of the textures can be limited, thus limiting the strength of the contrast modulation. The low contrast modulation can reduce the desired texture aesthetics. Second, creating microtextures using rollers or press molds can often leave waviness on the backside of the thin glass cover, which may lower the yield of other tile fabrication processes, such as lamination. Moreover, the visual effect created by the macrotextures can depend on viewing and/or lighting angles. At certain viewing angles, the macrotextures may be less visible.

In some embodiments, to overcome these challenges, the textured appearance of the glass cover can be created without the use of macrotextures or by using a very shallow macrotexture. Note that the 3D appearance of a structure is in fact post-processed by human brains and people have used 2D images to create 3D effects by manipulating the lighting and shadowing. Using the same principle, one may create the appearance of depth contrast of a texture by modulating the brightness of the glass surface.

FIG. 20 shows an exemplary roof tile cover having a tree bark surface texture, according to one embodiment. More specifically, the top drawing shows the overview of the roof tile cover, and the bottom drawing shows the amplified view of the texture pattern. Note that the surface of the roof tile is substantially flat, and the perceived texture pattern is in fact created by changing the color or brightness of the different regions on the flat cover.

Figure 21A:
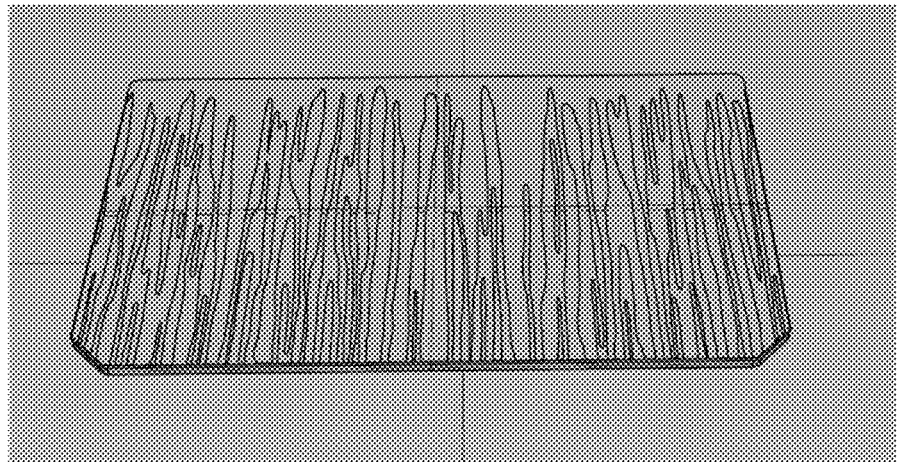
FIG. 21A shows a contour on a glass surface, according to one embodiment.

In some embodiments, changing the color or brightness of selected regions on a glass cover can be achieved using a selective surface treating technique. More specifically, a selected portion of the glass surface can be treated to achieve one microtexture, whereas the other portion of the glass surface can be treated differently to achieve a different microtexture. The contrast between the two microtextures can create a visual effect of a 3D macrotexture pattern. To do so, a contour can first be created on the glass surface, mimicking a tree bark pattern, as shown in FIG. 21A. The contour can be generated using a masking technology or can be generated during the initial glass rolling process where a very shallow macrotexture pattern can be created. A particular type of micro structure having a particular reflection property can then be created inside the contour, and a different type of micro structure having a different reflection property can be created outside the contour. The different microtexture patterns can create the appearance of a 3D macrotexture, as shown in FIG. 21B.

Figure 21B:
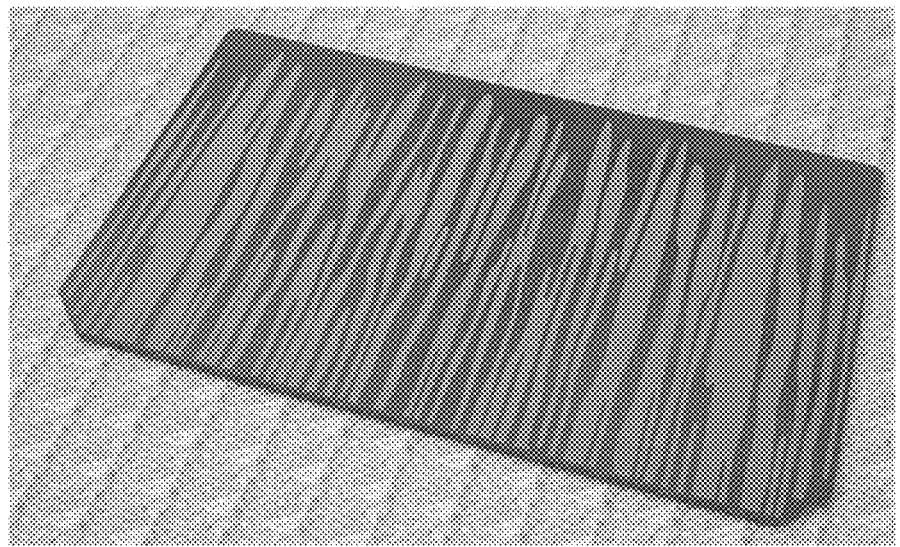
FIG. 21B shows an exemplary textured glass surface, according to one embodiment.

FIG. 21B shows an exemplary textured glass surface, according to one embodiment. In some embodiments, the micro structures within the contour can be generated by applying a matte coating on the glass surface. In further embodiments, screen printing can be used to apply the matte coating. The matte coating can have different glossy levels (e.g., scattering properties). The portions outside the contour can be left blank (i.e., without being textured) or have a different type of microtexture. In the example shown in FIG. 21B, the tree bark pattern can be defined by lines on a flat surface or can have a very small thickness, depending on the coating technology.

Colored Tile

In addition to the blue or grey color that is close to the natural color of the Si solar cells, solar roof customers may desire other roof colors, such as terracotta. However, conventional coloring techniques, such as applying paint or adding pigments, often depend on light absorbing principles, which often result in large losses in solar cell efficiency. An ideal solution for adding color should provide a square shaped reflection spectrum such that it only reflects wavelengths of the desired color, thus resulting in lower losses in solar cell efficiency. In some embodiments, a multilayer thin-film stack can be applied onto the tile surface to efficiently generate color for the solar roof without a significant loss of the solar cell efficiency. Moreover, the reflection spectrum should be angle-insensitive such that the color of the roof does not vary significantly at different viewing angles.

Figure 22A:
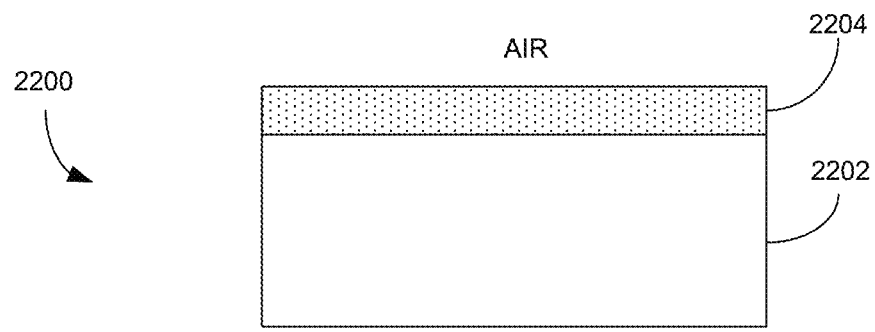
FIG. 22A presents an exemplary front glass cover, according to one embodiment.

FIG. 22A presents an exemplary front glass cover, according to one embodiment. Glass cover 2200 can include a glass substrate 2202 and a multilayer thin-film stack 2204. Glass substrate 2202 can be textured as discussed in the previous section. Multilayer thin-film stack 2204 can include alternating layers of materials having high and low refractive indices. However, unless conventional Bragg reflectors where the thicknesses of the high and low index layers are periodical, the thickness of each high or low index layer in multilayer thin-film stack 2204 can be optimized individually, according to a set of design objectives. More specifically, the thickness of each layer can be selected such that the solar cell efficiency can be maximized, the difference between the designed and targeted colors can be minimized, and the amount of variation in color across a large range of viewing angles can also be minimized.

Figure 22B:
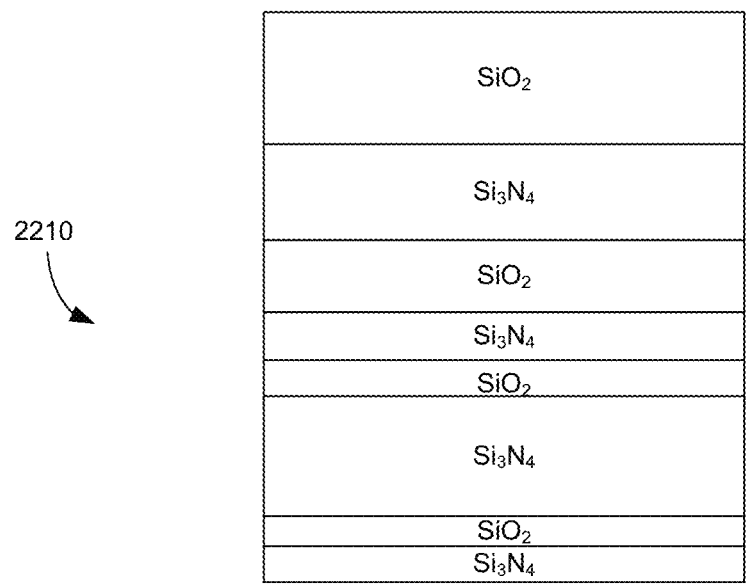
FIG. 22B presents an exemplary multilayer thin-film stack, according to one embodiment.

FIG. 22B presents an exemplary multilayer thin-film stack, according to one embodiment. In some embodiments, common materials that can be deposited using chemical-vapor deposition (CVD) or physical-vapor deposition (PVD) techniques, such as $SiO_2$, $SiN_x$, and ITO, can be used to form the multilayer thin-film stack. In the example shown in FIG. 22B, multilayer thin-film stack 2210 can include alternating layers of $SiO_2$ and $Si_3N_4$. As one can see in FIG. 22B, the thicknesses of the layers are not periodic. Also note that the thickness of each layer shown in FIG. 22 is for illustration purposes only and is not drawn to scale.

Figure 23A:
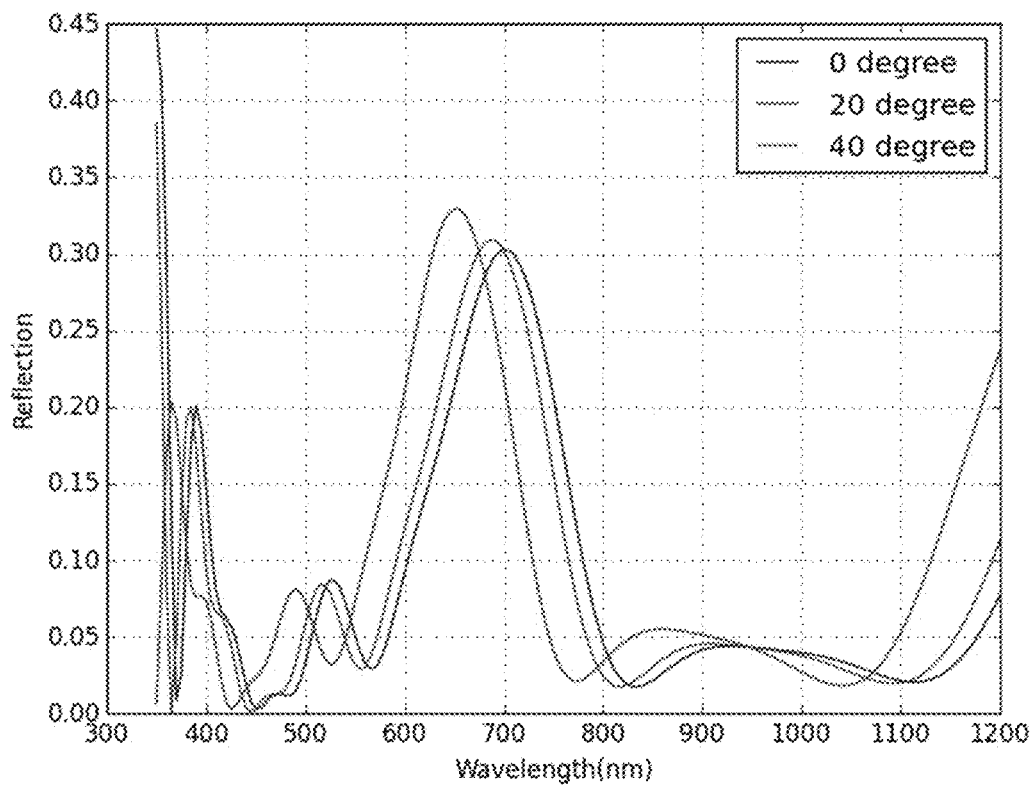
FIG. 23A shows the reflection spectrum of a multilayer thin-film stack on a glass substrate, according to one embodiment.
Figure 23B:
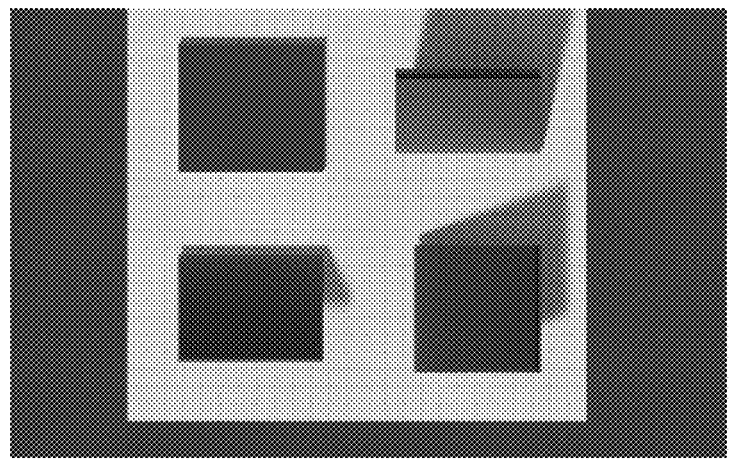
FIG. 23B shows the color appearance of the multilayer thin-film stack under different viewing angles, according to one embodiment.

In one embodiment, the thickness of each layer can be, from top to bottom, 211 nm, 242.8 nm, 120.5 nm, 10 nm, 41.5 nm, 250 nm, 13.3 nm, and 10 nm. In a different embodiment, the thickness of each layer can be, from top to bottom, 110.9 nm, 253.3 nm, 137.1 nm, 249.8 nm, 169.5 nm, 252.5 nm, 34.8 nm, and 10.5 nm. FIG. 23A shows the reflection spectrum of a multilayer thin-film stack on a glass substrate, according to one embodiment. One can see a slight shift in the reflection spectrum for different viewing angles. Moreover, in this scheme, the amount of average solar cell efficiency loss is roughly 7.5%, compared to up to 20% for the conventional coloring approaches. FIG. 23B shows the color appearance of the multilayer thin-film stack under different viewing angles, according to one embodiment.

Front Textured Solar Panel

Individually constructed solar roof tiles can successfully mimic the aesthetics of conventional roof tiles. However, producing such tiles can incur a higher cost than producing the conventional, less visually appealing solar panels. In addition, mounting individual tiles or tile modules on a roof can be more expensive than installing larger solar panels. In some embodiments, to reduce fabrication and installation cost, a solar roof can include larger solar panels having a textured front cover to create the look of individual tiles. More specifically, the front cover of a conventional solar panel can be replaced using a specially designed, textured front cover, with the texture structure including a series of steps to mimic the visual effect of shingled roof tiles.

Figure 24A:
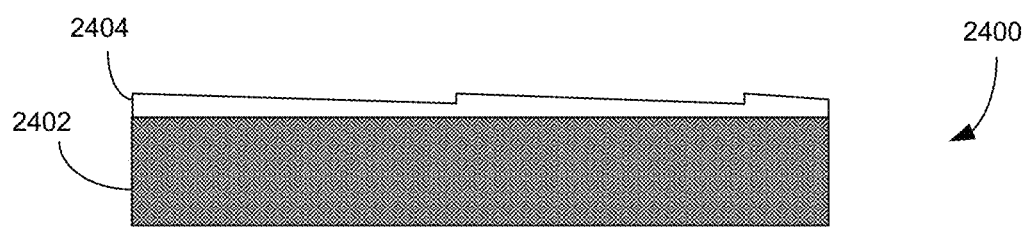
FIG. 24A illustrates the side view of an exemplary solar panel, according to one embodiment.
Figure 24B:
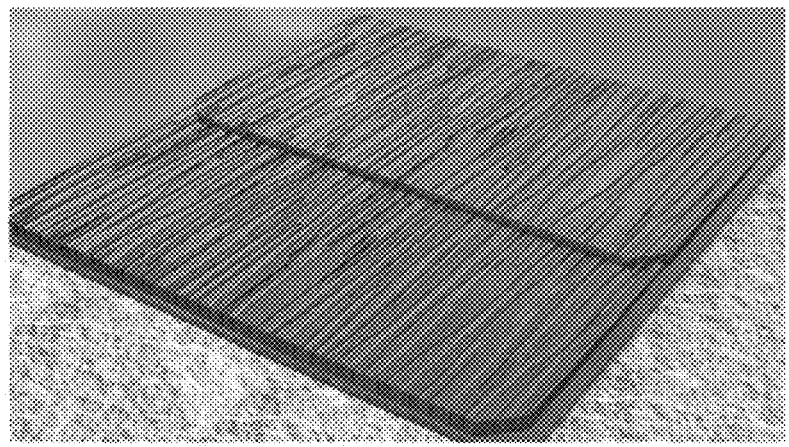
FIG. 24B shows a partial view of the panel, according to one embodiment.

FIG. 24A illustrates the side view of an exemplary solar panel, according to one embodiment. Solar panel 2400 can include a body 2402 and a textured front cover 2404. Body 2402 can be similar to the body of any conventional solar panel. More specifically, body 2402 can include a back cover, encapsulant, and interconnected solar cells. Textured front cover 2404 can be made of any suitable transparent material, including but not limited to: tempered glass and polyvinyl chloride (PVC). The sun-facing surface of front cover 2404 can be textured in such a way that a series of steps and gaps can be created to generate the visual effect of individual roof tiles. FIG. 24B shows a partial view of the panel, according to one embodiment. As one can see in FIG. 24B, the steps created by a texture technique generate the visual effect of shingled roof tiles. In addition to the step texturing, other surface texturing (e.g., a tree bark texture pattern) can also be created to achieve the desired aesthetics.

Figure 25A:
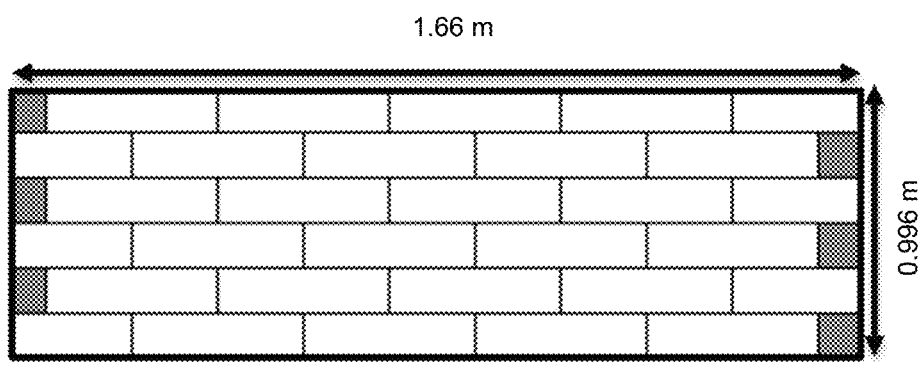
FIG. 25A illustrates the top view of an exemplary front cover of a solar panel, according to one embodiment.
Figure 25B:
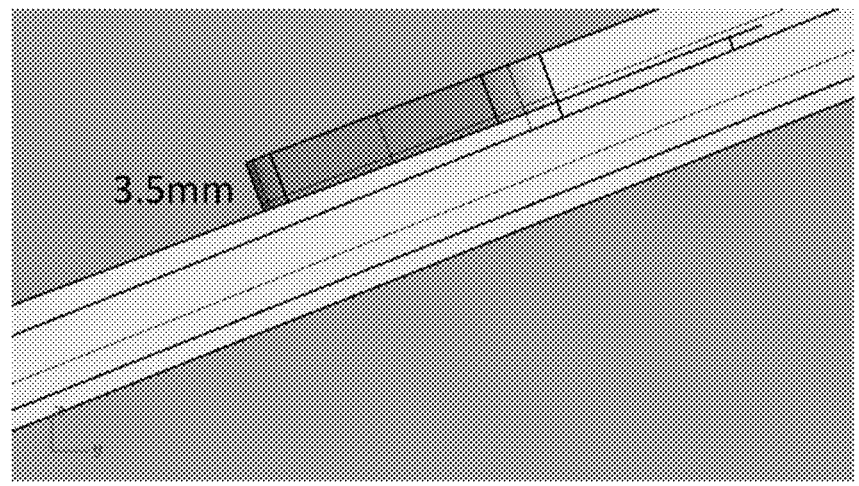
FIG. 25B illustrates the amplified side view of a step on the front cover, according to one embodiment.

FIG. 25A illustrates the top view of an exemplary front cover of a solar panel, according to one embodiment. The solar panel can have a dimension similar to a conventional panel. In this example, the solar panel can have a dimension of 1.66 m×0.996 m. The dark lines on the front cover are the steps and gaps created via a texturing technique. These dark lines create the effect of individual tiles. FIG. 25B illustrates the amplified side view of a step on the front cover, according to one embodiment. The height of the steps can be roughly a few millimeters. In this embodiment, the height of a step can be 3.5 mm. In some embodiments, to enhance the visual effect, the vertical surface of the steps can be decorated with a dark paint.

In some embodiments, to prevent water leakage, the edges, including both vertical and horizontal edges, of the front cover can include interlocking/overlapping mechanisms to facilitate interlocking between a solar panel and adjacent solar panels. More specifically, the interlocking mechanisms can include portions of the front cover that extend beyond the edges of the panel body.

Figure 26A:
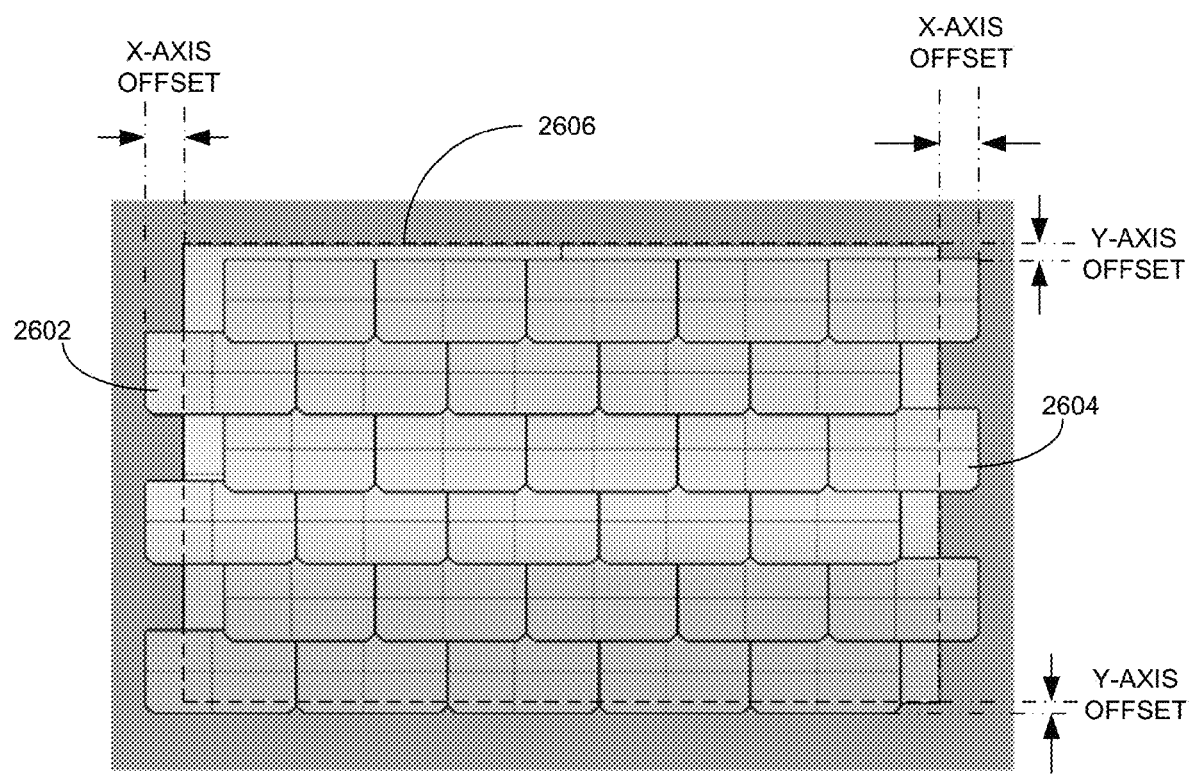
FIG. 26A shows the top view of an exemplary solar panel front cover, according to one embodiment.
Figure 26B:
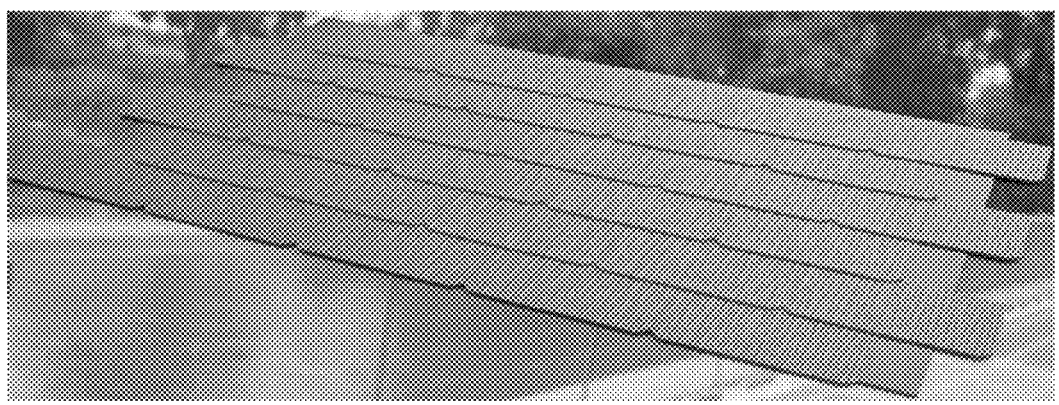
FIG. 26B shows the perspective view of the solar panel front cover, according to one embodiment.

FIG. 26A shows the top view of an exemplary solar panel front cover, according to one embodiment. In FIG. 26A, front cover 2600 includes portions (e.g., portion 2602) extending beyond the edges of the solar panel body, whose boundaries are defined by dashed box 2606. More specifically, offsets along the vertical edges are defined as the X-axis offsets and offsets along the horizontal edges are defined as Y-axis offsets. As one can see from FIG. 26A, the X-axis offsets can have an interdigitated pattern, where one row of perceived tiles extends in one direction and the adjacent row of tiles extends in the opposite direction. This arrangement can facilitate horizontal interlocking between adjacent solar panels on the roof FIG. 26B shows the perspective view of the solar panel front cover, according to one embodiment.

Figure 27:
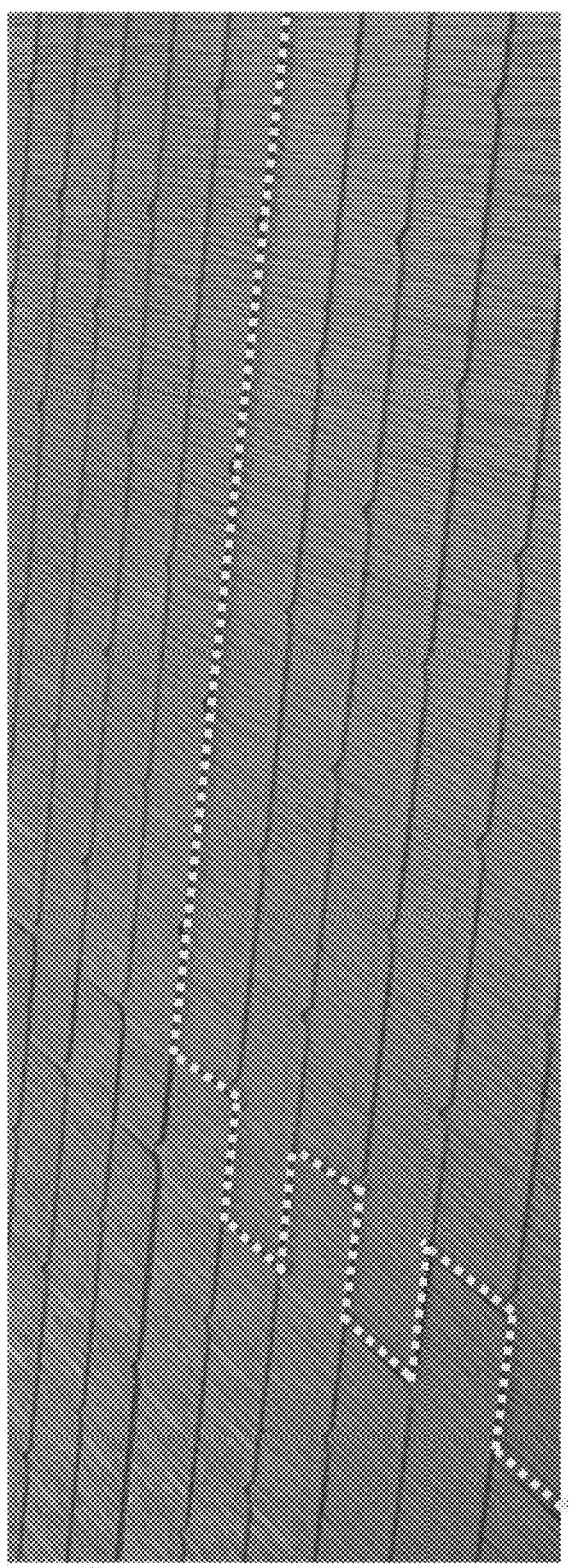
FIG. 27 shows multiple interlocking solar panels, according to one embodiment.

FIG. 27 shows multiple interlocking solar panels, according to one embodiment. The dashed line marks the borders among the interlocking solar panels.

In general, embodiments of the present invention provide a cost-effective way for achieving a desired aesthetic of a solar roof without sacrificing solar cell efficiency. By selecting solar cells with low color flop and by matching the background color with the natural color of the solar cells, one can reduce the amount of cell glow and effectively hide the solar cells. Moreover, by measuring the solar cell color and by grouping the solar cells based on their color during tile manufacture, one can ensure that most tiles have a single cell color and color distribution across the roof can be substantially homogenous. Other color control schemes can also include introducing color contrast among the tiles through surface treatment. Tiles with different brightness or lightness can then be randomly distributed across the roof to distract the viewers' attention from the difference between PV tiles and non-PV tiles.

The foregoing descriptions of various embodiments have been presented only for purposes of illustration and description. They are not intended to be exhaustive or to limit the present system to the forms disclosed. Accordingly, many modifications and variations will be apparent to practitioners skilled in the art. Additionally, the above disclosure is not intended to limit the present system.

What is claimed is:

1. A photovoltaic roof, comprising:
a first photovoltaic roof tile, comprising:
   a first transparent front cover;
   a first back cover;
   a first plurality of photovoltaic structures positioned between the first transparent front cover and the first back cover, wherein a respective photovoltaic structure has a front surface facing the first transparent front cover and comprises one or more solar cells; and
   a first colored layer extending across a surface of the first back cover, wherein the first colored layer is a first background color that matches a color of the front surfaces of the first plurality of photovoltaic structures; and
a second photovoltaic roof tile, comprising:
   a second transparent front cover;
   a second back cover;
   a second plurality of photovoltaic structures positioned between the second transparent front cover and the second back cover, wherein a respective photovoltaic structure has a front surface facing the second transparent front cover and comprises one or more solar cells; and
   a second colored layer extending across a surface of the second back cover, wherein the second colored layer is a second background color different from the first background color, the first and second background colors being selected to mitigate contrast within a respective photovoltaic roof tile, wherein the first background color contrasts more with colors of front surfaces of the second plurality of photovoltaic structures than with the colors of the front surfaces of the first plurality of photovoltaic structures.

2. The photovoltaic roof of claim 1, wherein the front surface of each one of the first and second plurality of photovoltaic structures is textured using a reactive ion etching (RIE) technique.

3. The photovoltaic roof of claim 1, wherein the first and second colored layers are different shades of blue or grey.

4. The photovoltaic roof of claim 1, wherein a front surface of the first transparent front cover is textured.

5. The photovoltaic roof of claim 4, wherein the textured front surface of the first transparent front cover comprises a first texture pattern superimposed on a second texture pattern, and wherein a feature size of the first texture pattern is smaller than a feature size of the second texture pattern.

6. The photovoltaic roof of claim 1, wherein the first colored layer comprises a polymer-based paint and wherein the surface of the first back cover the first colored layer extends across faces away from the first transparent front cover.

7. The photovoltaic roof of claim 1, wherein the first transparent front cover and the second transparent front cover comprise fortified or tempered glass.

8. The photovoltaic roof of claim 7, wherein the first back cover and the second back cover comprise fortified or tempered glass.

9. The photovoltaic roof of claim 1, wherein the first plurality of photovoltaic structures and the second plurality of photovoltaic structures are formed from polycrystalline-Si material.

10. The photovoltaic roof of claim 1, wherein the first photovoltaic roof tile further comprises an anti-reflective (AR) coating disposed atop the first transparent layer.

11. The photovoltaic roof of claim 1, wherein the first plurality of photovoltaic structures is a string of shingled photovoltaic strips.

12. The photovoltaic roof of claim 1, wherein a color of a first photovoltaic structure of the first plurality of photovoltaic structures is different than a color of a second photovoltaic structure of the first plurality of photovoltaic structures.

* * * * *